(12) United States Patent
Endo et al.

(10) Patent No.: US 6,949,329 B2
(45) Date of Patent: Sep. 27, 2005

(54) PATTERN FORMATION METHOD

(75) Inventors: Masayuki Endo, Izumi (JP); Masaru Sasago, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 250 days.

(21) Appl. No.: 10/166,247

(22) Filed: Jun. 11, 2002

(65) Prior Publication Data

US 2003/0017425 A1 Jan. 23, 2003

(30) Foreign Application Priority Data

Jun. 22, 2001 (JP) ........................................ 2001-189262

(51) Int. Cl.⁷ ................................................ G03F 7/00
(52) U.S. Cl. ................... 430/322; 430/270.1; 430/296; 430/330
(58) Field of Search ............................ 430/270.1, 322, 430/296, 330

(56) References Cited

U.S. PATENT DOCUMENTS

| | | | |
|---|---|---|---|
| 6,042,997 A | 3/2000 | Barclay et al. | |
| 6,261,738 B1 * | 7/2001 | Asakura et al. | 430/270.1 |
| 6,372,406 B1 * | 4/2002 | Brunsvold et al. | 430/270.1 |
| 6,489,080 B2 | 12/2002 | Uenishi et al. | |
| 6,506,535 B1 | 1/2003 | Mizutani et al. | |
| 6,537,718 B2 * | 3/2003 | Nishiyama et al. | 430/170 |
| 6,630,280 B1 * | 10/2003 | Fujimori et al. | 430/270.1 |
| 6,645,698 B1 | 11/2003 | Thackeray et al. | |
| 6,682,869 B2 * | 1/2004 | Ohsawa et al. | 430/270.1 |
| 2001/0038970 A1 | 11/2001 | Cameron et al. | |

FOREIGN PATENT DOCUMENTS

| | | |
|---|---|---|
| JP | 10-186665 | 7/1998 |
| JP | 11-167200 | 6/1999 |
| JP | 2000-187330 A | 7/2000 |
| JP | 2000-241965 A | 9/2000 |
| JP | 2001-75283 | 3/2001 |
| JP | 2001-075284 A | 3/2001 |
| JP | 2001-154363 A | 6/2001 |
| JP | 2001-159812 A | 6/2001 |
| JP | 2002-156759 A | 5/2002 |

* cited by examiner

Primary Examiner—Kathleen Duda
(74) Attorney, Agent, or Firm—McDermott Will & Emery LLP

(57) ABSTRACT

A resist film with a thickness of 250 nm or less is formed on a semiconductor substrate from a positive chemically amplified resist material including a base polymer whose solubility in an alkaline developer is changed by a function of an acid and an acid generator that has at least one electron attractive group introduced into a meta-position of an aromatic ring included in a counter action and generates an acid through irradiation with electron beams. The resist film is subjected to pattern exposure by irradiating with electron beams or extreme UV of a wavelength of a 1 nm through 30 nm band. The resist film is developed after the pattern exposure, thereby forming a resist pattern.

9 Claims, 5 Drawing Sheets

PATTERN FORMATION METHOD

BACKGROUND OF THE INVENTION

The present invention relates to a pattern formation method for use in fabrication of semiconductor integrated circuit devices and the like, and more particularly, it relates to a method for forming a resist pattern by selectively irradiating a resist film of a positive chemically amplified resist material with electron beams or extreme UV of a wavelength of a 1 nm through 30 nm band.

In accordance with recently increased degrees of density and integration of semiconductor integrated circuits, the wavelength of exposing light used in photolithography has been more and more shortened. Recently, extreme UV (of a wavelength of a 300 nm band or shorter) and krF excimer laser (of a wavelength of a 248 nm band) are practically used, and ArF excimer laser (of a wavelength of a 193 nm band) will be put to practical use in the near future. However, these exposing light cannot be used in very fine processing with a design rule of 100 nm or less because of their disadvantage of resolution performance.

Therefore, photolithography using, as exposing light applicable to very fine processing, $F_2$ laser (of a wavelength of a 157 nm band) or electron beam is now under examination, but a resist material suitable to $F_2$ laser or electron beams has not been found yet.

As a resist material for electron beams, a resist composition with a principal chain to be cut (as one disclosed in, for example, Japanese Laid-Open Patent Publication No. 1-163738) is used for forming a mask or the like. However, this resist material cannot be used in very fine processing for fabrication of semiconductor devices because its sensitivity and resolution are too low.

In order to overcome these disadvantages, examination is being made on and a large number of papers have been presented on a chemically amplified resist material using a catalytic function of an acid generated through irradiation with energy beams. However, such a resist material still has a large number of problems to overcome before being put to practical use.

For example, Japanese Laid-Open Patent Publication Nos. 7-209868, 11-305440, 2000-66401 and the like disclose a resist material including a combination of poly (hydroxystyrene/styrene/tert-butyl acrylate) and triphenylsulfonium trifluoromethanesulfonate, and Japanese Laid-Open Patent Publication Nos. 7-261377, 8-179500 and the like disclose a resist material including a combination of a mixed polymer of poly(p-hydroxystyrene/styrene/tert-butyl acrylate) and poly(p-hydroxystyrene/tert-butyl acrylate) and triphenylsulfonium trifluoromethanesulfonate. In these resist materials, however, trifluoromethanesulfonic acid generated through irradiation with energy beams has high volatility and easily moves. Therefore, under conditions where a high vacuum state is kept for a long time as in the use of electron beams, the acid volatilizes or moves during time from exposure to annealing, and hence, a very fine pattern cannot be satisfactorily formed.

For example, Japanese Laid-Open Patent Publication No. 2000-66382 and the like disclose a resist material including a combination of poly(p-hydroxystyrene/styrene/tert-butyl acrylate) and triphenylsulfonium p-toluenesulfonate. However, the degree of acidity of p-toluenesufonic acid generated through irradiation with energy beams is too low to attain sufficient sensitivity for practical use.

For example, Japanese Laid-Open Patent Publication No. 8-146610 and the like disclose a resist material including a combination of poly(p-hydroxystyrene/tert-amyl methacrylate) and triphenylsulfonium trifluoromethanesulfonate, and J. Photopolym. Sci. Technol., 1997, Vol. 10 (No. 3), pp. 397–408 by H. Ito et al., J. Photopolym. Sci. Technol., 1996, Vol. 9(No. 4), pp. 557–572 by H. Ito et al., Japanese Laid-Open Patent Publication Nos. 7-261377 and 8-179500 and the like disclose a resist material including a combination of poly(p-hydroxystyrene/tert-butyl acrylate) and triphenylsulfonium trifluoromethanesulfonate. However, due to the volatility and mobility of trifluoromethanesulfonic acid generated through irradiation with energy beams, a very fine pattern cannot be satisfactorily formed by using any of these resist materials. Also, even when a pattern is formed, the dry etching resistance of these polymer is too low for practical use.

For example, Japanese Laid-Open Patent Publication No. 11-305440 and the like disclose a resist material including a combination of poly(hydroxystyrene/styrene/tert-butyl acrylate) and triphenylsulfonium perfluorobutanesulfonate, and Japanese Laid-Open Patent Publication No. 2000-66382 and the like disclose a resist material including a combination of poly(p-hydroxystyrene/styrene/tert-butyl acrylate) and triphenylsulfonium perfluorobutanesulfonate. However, the degree of acidity of perfluoroalkanesulfonic acid such as perfluorobutanesulfonic acid generated through irradiation with energy beam is too low, and hence, the sensitivity is too low and the dissolution inhibiting property is too strong. Therefore, a pattern cannot be formed in a good shape by using any of these resist materials.

For example, Japanese Laid-Open Patent Publication No. 7-209868 and the like disclose a resist material including a combination of poly(hydroxystyrene)/styrene/tert-butyl acrylate) and N-(trifluoromethylsulfonyloxy)bicyclo-[2,2, 1]-hept-5-en-2,3-dicarboxyimide. Also, ACS. Symp Ser., 1995, Vol. 614 (Microelectronics Technology), pp. 21–34 by H Ito to et al., J. Photopolym. Sci. Technol., 1996, Vol. 9 (No. 4)., pp. 557–572 by H. Ito et al. and the like disclose a resist material including a combination of poly(p-hydroxystyrene/tert-butyl actylate) and N-camphorsulfonyloxynaphthalimide of N-trifluoromethanesulfonyloxy-5-norbornene-2,3-dicarboxyimide. However, trifluoromethanesulfonic acid used in these resist materials has the same disadvantage as that described above, and hence, these resist materials cannot be used in very fine processing. Also, the degree of acidity of camphorsulfonic acid is too low to attain sufficient sensitivity of the resist material.

For example, Japanese Laid-Open Patent Publication No. 11-167200, European Patent Publication No. 813113 and the like disclose a resist material including a combination of poly(p-hydroxystyrene/styrene/tert-butyl acrylate) and di-(4-tert-butylphenyl)iodonium iodoniumcamphorsulfonate, Japanese Laid-Open Patent Publication No. 11-305441 and the like disclose a resist material including a combination of poly(hydroxystyrene/styrene/tert-butyl acrylate) and di-(4-tert-butylphenyl)iodoniumperfluorobutanesulfonate, and Japanese Laid-Open Patent Publication No. 2000-89453 and the like disclosure a resist material including a combination of poly(hydroxystyrene/tert-butyl actylate) and di-(4-tert-butylphenyl)iodoniumcamphorsulfonate. However, since iodonium salt is used in these resist materials, the dissolution inhibiting property is too low to attain high contrast and the sensitivity and the resolution are insufficient. Therefore, these resist materials cannot be used in very fine processing.

For example, Japanese Laid-Open Patent Publication No. 2000-187330 and the like disclose a resist material including a combination of poly(p-1-tert-butoxyethoxystyrene/p-hydroxystyrene) and 4-butoxyphenyldiphenylsulfonium 4-trifluoromethylbenzenesulfonate, Japanese Laid-Open Patent Publication No. 9-160246 and the like disclosure a resist material including a combination of poly(p-1-ethoxyethoxystyrene/p-hydroxystyrene/p-tert-butoxystyrene) and diphenyl-4-tert-butoxyphenylsulfonium p-toluenesulfonate, and Japanese Laid-Open Publication No. 9-211866 and the like disclose a resist material including a combination of poly(p-1-methoxypropoxystyrene/p-hydroxystyrene/p-tert-butoxycarbonyloxystyrene) and tris(4-tert-butoxyphenyl)sulfonium trifluoromethanesulfonate. However, a polymer having a non-cyclic acetal group as a protecting group cannot be formed into a desired pattern shape because electron beams are fluctuated due to a gas generated through decomposition during beam irradiation (what is called the outgassing), and the side face of the pattern is severely roughened. Also, in the case where trifluoromethanesulfonic acid is generated, the degree of volatility is so high that an insoluble skin layer is formed, and hence, a pattern cannot be formed.

For example, Japanese Laid-Open Patent Publication Nos. 7-261377, 8-179500 and 2000-187330 and the like disclose a resist material including a combination of poly(p-tert-butoxycarbonylmethoxystyrene/p-hydroxystyrene) and triphenylsulfonium trifluoromethanesulfonate. However, a very fine pattern cannot be satisfactorily formed by using this resist material due to the volatility and mobility of trifluoromethanesulfonic acid generated through irradiation with energy beams.

For example, Japanese Laid-Open Patent Publication Nos. 9-160246, 9-211866, 11-344808, 2000-122296 and 2000-187330 and the like disclose a resist material including triphenylsulfonium pentafluorobenzenesulfonate, tris(tert-butylphenyl)sulfonium pentafluorobenzenesulfonate, tris(tert-butoxyphenyl)sulfonium pentafluorobenzenesulfonate, triphenylsulfonium 3-trifluoromethylbenzenesulfonate, bis(4-methylphenyl)phenylsulfonium, 3,5-bis(trifluoromethyl)benzenesulfonate or the like. However, all polymers to be used in combination with these compounds have a non-cyclic acetal group as a protecting group, and hence, the problems of the fluctuation of electron beams owing to the outgassing and the roughness on the side face of the pattern cannot be avoided.

As described above, a positive chemically amplified resist material used for irradiation under vacuum with exposing light of electron beams or extreme UV with a 1 nm through 30 nm wavelength band has the following significant problems. The degree of volatility of an acid generated through irradiation with energy beam is high and the acid easily moves; the dry etching resistance of a polymer to be used is insufficient; the adhesion to a substrate is poor; a desired pattern cannot be formed due to the fluctuation of beams caused during the irradiation with the energy beams by decomposition/elimination of a protecting group suspended in a polymer; and the degree of acidity of an acid generated through irradiation with energy beam is too low to attain sufficient sensitivity of the resist material.

In the case where a fine pattern is to be formed by using electron beams or extreme UV as the exposing light, if the resist film has a large thickness, the aspect ratio of the resultant resist pattern is very high. When the aspect ratio of the resist pattern is high, the resist pattern cannot keep its shape and hence partly collapses, namely, a problem of pattern collapse is caused.

Accordingly, the resist film should have a thickness of 250 nm or less. When the resist film has a thickness of 250 nm or less, the problem of pattern collapse is minimally caused and the resolution of the resist film can be improved.

However, when the thickness of the resist film is smaller than 250 nm, the solubility in an alkaline developer of the resist film is increased even in an unexposed portion, which reduces the contrast in the solubility (namely, the contrast between the solubility of an unexposed portion and the solubility of an exposed portion). As a result, the resolution is disadvantageously lowered.

SUMMARY OF THE INVENTION

In consideration of the aforementioned conventional problems, an object of the invention is providing a pattern formation method in which lowering of resolution can be suppressed by preventing lowering of contrast in solubility even when a resist film has a thickness smaller than 250 nm.

In order to achieve the object, the present invention made various examinations on means for improving the contrast between the solubility (dissolution) of an unexposed portion and the solubility (dissolution) of an exposed portion. As a result, it has been found that the dissolution inhibiting property given to the base polymer by an acid generator can be increased by introducing an electron attractive group into a meta-position of an aromatic ring included in a counter anion of the acid generator. The present invention was devised on the basis of this finding and is specifically as follows:

The pattern formation method of this invention comprises the steps of forming a resist film with a thickness of 250 nm or less from a positive chemically amplified resist material including a base polymer whose solubility in an alkaline developer is changed by a function of an acid and an acid generator that has at least one electron attractive group introduced into a meta position of an aromatic ring included in a counter anion and generates an acid through irradiation with energy beams; performing pattern exposure by selectively irradiating the resist film with electron beams or extreme UV of a wavelength of a 1 nm through 30 nm band; and developing the resist film after the pattern exposure, whereby forming a resist pattern.

According to the pattern formation method of this invention, since at least one electron attractive group is introduced into a meta-position of an aromatic ring included in the counter anion of the acid generator, the acid generator can attain a higher hydrophobic property than a conventional acid generator, and hence, the dissolution inhibiting property given to the base polymer by the acid generator can be increased. Therefore, in a region of an unexposed portion of the resist film in contact with an exposed portion, namely, in a region that is slightly exposed, the base polymer is difficult to dissolve in an alkaline developer. As a result, the contrast between the solubility of the unexposed portion and the solubility of the exposed portion can be increased, so as to improve the resolution of the resist film.

The pattern formation method preferably further comprises, between the step of performing pattern exposure and the step of developing the resist film, a step of performing post-exposure-bake on the resist film at a temperature of 120° C. through 150° C.

Since the dissolution inhibiting property given to the base polymer by the acid generator is increased in the pattern formation method of this invention, the solubility in an alkaline developer of the exposed portion of the resist film is also disadvantageously lowered. However, when the resist film is subjected to post-exposure-bake at a temperature of 120° C. through 150° C., the solubility in an alkaline developer of the exposed portion of the resist film can be improved.

In the pattern formation method, the acid generator preferably includes a compound represented by general formula (1):

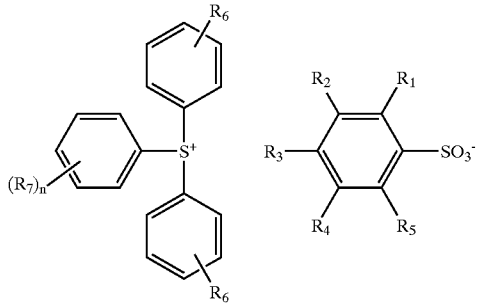

(1)

wherein $R_2$ and $R_4$ are the same or different and are selected from the group consisting of a hydrogen atom, a halogen atom, a nitro group and a trifluoromethyl group, at least one of which is not a hydrogen atom; $R_1$, $R_3$ and $R_5$ are the same or different and are a hydrogen atom or a halogen atom; $R_6$ and $R_7$ are the same or different and are a hydrogen atom or a linear or branched alkyl group having a carbon number of 1 through 4; and n is an integer of 1 through 3.

When the acid generator includes the compound represented by general formula (1), it is preferred that $R_6$ is a hydrogen atom or a linear or branched alkyl group having a carbon number of 1 through 4, and that $R_7$ is a linear or branched alkyl group having a carbon number of 1 through 4.

Also when the acid generator includes the compound represented by general formula (1), a counter anion of the compound represented by general formula (1) is preferably pentafluorobenzenesulfonate, 3-trifluoromethylbenzenesulfonate or 3,5-di-trifluoromethylbenzenesulfonate.

Furthermore, when the acid generator includes the compound represented by general formula (1), the acid generator preferably further includes a compound represented by general formula (2):

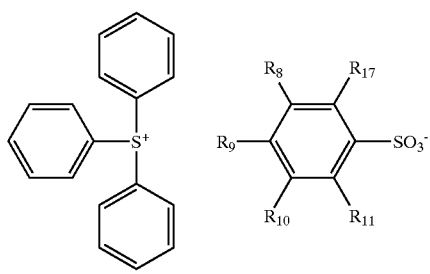

(2)

wherein $R_8$ and $R_{10}$ are the same or different and are selected from the group consisting of a hydrogen atom, a halogen atom, a nitro group and a trifluoromethyl group, at least one of which is not a hydrogen atom; and $R_9$, $R_{11}$ and $R_{17}$ are the same or different and are a hydrogen atom or a halogen atom.

When the acid generator includes the compound represented by general formula (2), a counter anion of the compound represented by general formula (2) is preferably pentafluorobenzenesulfonate, 3-trifluoromethylbenzenesulfonate or 3,5-di-trifluoromethylbenzenesulfonate.

When the acid generator includes the compound represented by general formula (1) and the compound represented by general formula (2), a weight ratio of the compound represented by general formula (1) to the compound represented by general formula (2) is preferably 0.2 through 2.0.

When the acid generator includes the compound represented by general formula (1) and the compound represented by general formula (2), the compound represented by general formula (1) is preferably diphenyl-2,4,6-trimethylphenylsulfonium pentafluorobenzenesulfonate or diphenyl-4-methylphenylsufonium pentafluorobenzensulfonate, and the compound represented by general formula (2) is preferably triphenylsulfonium pentafluorobenzenesulfonate or triphenylsulfonium 3-trifluoromethylbenzenesulfonate.

In the pattern formation method of this invention, the base polymer preferably includes a first monomer unit represented by general formula (3), a second monomer unit represented by general formula (4) and a third monomer unit represented by general formula (5):

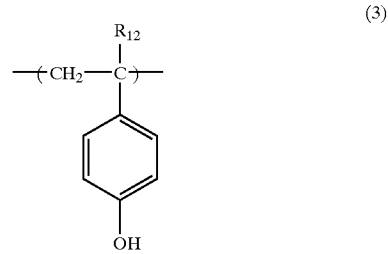

(3)

wherein $R_{12}$ or hydrogen atom or a methyl group;

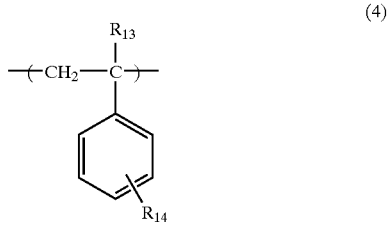

(4)

wherein $R_{13}$ is a hydrogen atom or a methyl group; and $R_{14}$ is a hydrogen atom or a linear or branched alkyl group having a carbon number of 1 through 4;

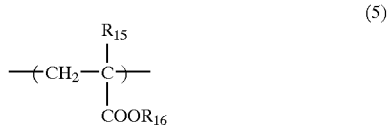

(5)

wherein $R^{15}$ is a hydrogen atom or a methyl group; and $R_{16}$ is a protecting group.

When the base polymer includes the first monomer unit represented by general formula (3), the second monomer unit represented by general formula (4) and the third monomer unit represented by general formula (5) it is preferred, in general formula (5), that $R_{16}$ is a tert-butyl group, a tert-pentyl group, a 1-methylcyclohexyl group, a tetrahydropyranyl group, a tetrahydrofuranyl group, a 1-adamantyl group, a 2-methyl-2-adamantyl group or a 4-methyl-2-oxo-4-tetrahydropyranyl group.

In thee pattern formation method of this invention, the base polymer preferably includes a compound represented by general formula (6):

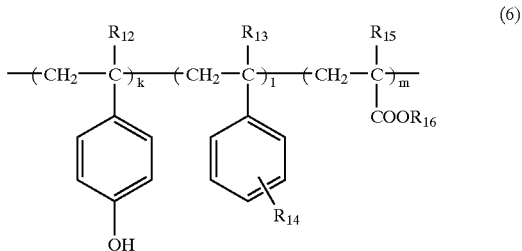

(6)

wherein $R_{12}$ is a hydrogen atom or a methyl group, $R_{13}$ is a hydrogen atom or a methyl group; $R_{14}$ is a hydrogen atom or a linear or branched alkyl group having a carbon number of 1 through 4; $R_{15}$ is a hydrogen atom or a methyl group; $R_{16}$ is a protecting group; and k, 1 and m are positive integers satisfying $0.25 \approx 1/(k+1+m) \approx 0.10$ and $0.20 \approx m/(k+1+m) \approx 0.07$.

In the pattern formation method of this invention, the base polymer preferably has a weight-average molecular weight of 5,000 through 20,000 and a degree of dispersion of 1.0 through 2.5.

DETAILED DESCRIPTION OF THE INVENTION

Figure 1:
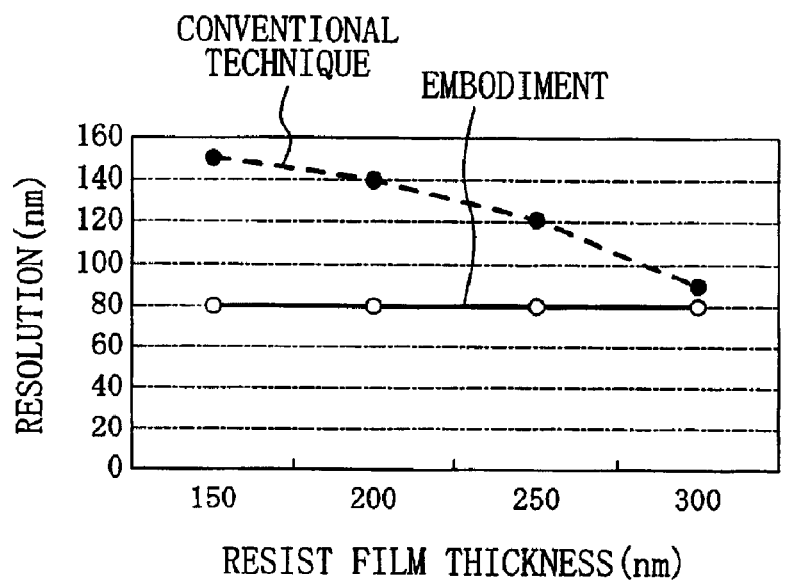
FIG. 1 is a diagram for showing the relationship between the thickness of a resist film and the resolution of line and space in an embodiment of the invention and in conventional technique.

A pattern formation method according an embodiment of the invention will now be described.

First, a positive chemically amplified resist material including a base polymer whose solubility in an alkaline developer is changed by a function of an acid; and an acid generator that has at least one electron attractive group introduced into a metal-position of an aromatic ring included in a counter anion and generates an acid through irradiation with energy beams is prepared. The chemically amplified resist material includes the base polymer, the acid generator, a solvent, an organic basic compound and a surface active agent, and these constituents will be described later.

Next, the chemically amplified resist material is applied on a semiconductor substrate such as a silicon wafer by spin coating or the like, and the resultant semiconductor substrate is subjected to pre-bake by using a hot plate at a temperature of, for example, 70 through 150° C. for 60 through 120 seconds, so as to form a resist film with a thickness of 100 nm through 1000 nm. The thickness of the resist film is preferably 250 nm or less, for example, 150 nm through 250 nm, and more preferably 150 nm through 200 nm. Thus, the resolution of the resist film can be improved and a problem of pattern collapse is minimally caused in the resultant resist pattern.

Then, the resist film is subjected to pattern exposure by selectively irradiating with electron beams or extreme UV a wavelength of a 1 nm through 30 nm band. After the pattern exposure, the resist film is subjected to post-exposure-bake by using a hot plate for 60 through 120 seconds. In this manner, an acid is generated in an exposed portion of the resist film through the irradiation with the electron beams or extreme UV, and a protecting group included in the base polymer is dissociated owing to the function of the acid and the heating of the post-exposure bake, so as to generate carboxylic acid. As a result, the base polymer becomes alkali-soluble.

The temperature of the post-exposure-bake is preferably 120° C. through 150° C. and more preferably 130° C. through 150° C. Thus, the solubility in an alkaline developer of the exposed portion of the resist film, in which the dissolution inhibiting property is increased due to the acid generator, can be improved.

After the post-exposure-bake, the resist film is developed with an alkaline developer for 30 through 120 seconds by a spraying method, a puddling method or a dipping method, and the resultant resist film is cleaned. Thus, the resist pattern is formed.

As the alkaline developer, an alkaline aqueous solution including generally 0.01 through 20 wt % of and preferably 5 wt % of an alkaline compound, such as an alkali metal hydroxide, ammonia water, alkylamines, alkanolamines, heterocyclic amine, tetraalkylammonium hydroxides. A particularly preferred alkaline developer is an aqueous solution of a tetraalkylammonium hydroxide. Also, a water-soluble organic solvent, such as methanol or ethanol, or a surface active agent may be appropriately added to the developer of the alkaline aqueous solution.

According to this embodiment, since at least one electron attractive group is introduced into a meta-position of the aromatic ring included in the counter anion of the acid generator, the hydrophobic property of the acid generator is higher than that of a conventional acid generator, so that the dissolution inhibiting property given to the base polymer by the acid generator can be increased. Therefore, in a region of the unexposed portion of the resist film in contact with the exposed portion, namely, in a region that is slightly exposed, the base polymer is difficult to dissolve in the alkaline developer. Accordingly, the contrast between the solubility of the unexposed portion and the solubility of the exposed portion can be increased, resulting in improving the resolution of the resist film.

Also, since the post-exposure-bake is performed at a temperature of 120° C. through 150° C. the soluble in the alkaline developer of exposed portion of the resist film, whose dissolution inhibiting property is increased by the acid generator, can be improved.

In the base polymer used in the pattern formation method of this embodiment, a protecting group that is not decomposed and dissociated unless heated in the presence of an acid is suspended differently from a polymer in which a non-cyclic acetal group or the like that is immediately decomposed without heating in the presence of an acid is suspended as a protecting group. Accordingly, outgassing is minimally caused during the irradiation with, for example, electron beams, and hence, there is less fear of fluctuation of the electron beams.

Such a base polymer may be insufficient in the etching resistance, which can be coped with by introducing an alkyl group into an aromatic ring of a styrene unit or by introducing an alicyclic hydrocarbon group into an ester of (meth)acrylate.

Furthermore, the acid generator used in the pattern formation method of this embodiment is an aromatic sulfonium salt, and in order to dissociate carboxylate through irradiation with low energy (namely, at high sensitivity) and suppress the volatility or the mobility of the acid as far as possible, at least one electron attractive group (such as a halogen atom, a nitro group and a trifluoromethyl group) is introduced into the meta-position of the aromatic ring included in the counter anion of the acid generator. Accordingly, the counter anion site generates aromatic sulfonic acid having a particularly high degree of acidity.

Also, in the resist material used in the pattern formation method of this embodiment, the volatility and the mobility of the generated acid is so small that PED (Post-Exposure-Delay) and storage stability can be negligible.

Now, results of experiments performed for evaluating the pattern formation method of this embodiment will be described.

FIG. 1 shows the relationship between the thickness of a resist film and the resolution of line and space in this embodiment and in conventional technique, in both of which pattern exposure is performed by using an EB projection exposure system (with an accelerating voltage of 100 keV) before carrying out post-exposure-bake at a temperature of 130° C. for 90 seconds. As is understood from FIG. 1, the resolution is not lowered in the pattern formation method of this invention even when the thickness of the resist film is smaller than 250 nm.

Figure 2:
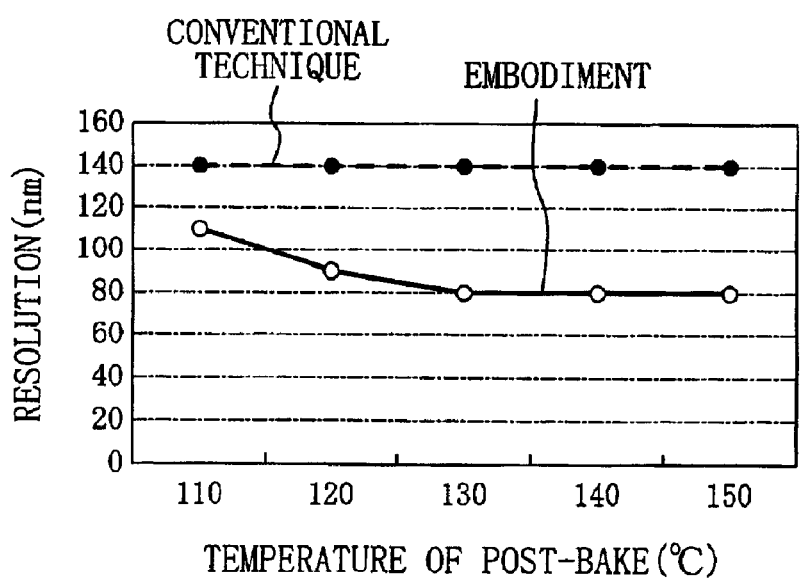
FIG. 2 is a diagram for showing the relationship between the temperature of post-exposure-bake and the resolution of line and space in the embodiment of the invention and in conventional technique.

FIG. 2 shows the relationship between the temperature of post-exposure-bake and the resolution of line and space in this embodiment and in conventional technique, in both of which a resist film with a thickness of 200 nm is subjected to pattern exposure performed by using an EB projection exposure system (with an accelerating voltage of 100 keV) before carrying out post-exposure-bake for 90 seconds. It is understood from FIG. 2 that high resolution can be attained even when the resist film has a small thickness as far as the post-exposure-bake is carried out at a temperature of 120° C. through 150° C.

(Acid generator)

Now, the acid generator included in the chemically amplified resist material used in the pattern formation method of this embodiment will be described.

The acid generator preferably includes a compound represented by the following general formula (1):

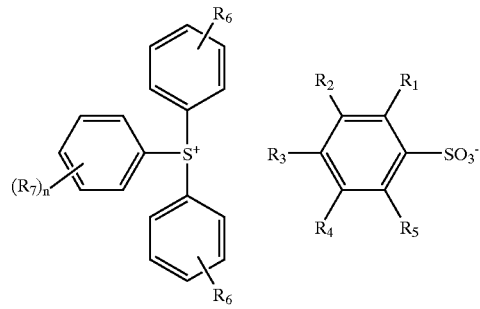

wherein $R_2$ and $R_4$ are the same or different and are selected from the group consisting of a hydrogen atom, a halogen atom, a nitro group and a trifluoromethyl group, at least one of which is not a hydrogen atom; $R_1$, $R_3$ and $R_5$ are the same or different and are a hydrogen atom or a halogen atom; $R_6$ and $R_7$ are the same or different and are a hydrogen atom or a linear or branched alkyl group having a carbon number of 1 through 4; and n is an integer of 1 through 3. It is preferred that $R_6$ is a hydrogen atom or a linear or branched alkyl group having a carbon number of 1 through 4 and that $R_7$ is a linear or branched alkyl group having a carbon number of 1 through 4.

Examples of the halogen atom are a fluorine atom, a chlorine atom and a bromine atom.

Examples of the linear or branched alkyl group having a carbon number of 1 through 4 are a methyl group, an ethyl group, an n-propyl group, an isopropyl group, an n-butyl group, an isobutyl group, a sec-butyl group and a tert-butyl group, but such an alkyl group is not limited to these groups.

Examples of the counter anion of the compound represented by general formula (1) are pentafluorobenzenesulfonate, 3-trifluoromethylbenzenesulfonate and 3,5-di-trifluoromethylbenzenesulfonate.

Typical examples of the compound represented by general formula (1) are diphenyl-2,4,6-trimethylphenylsulfonium pentafluorobenzenesulfonate and diphenyl-4-methylphenylsulfonium pentafluorobenzenesulfonate.

Furthermore, the acid generator preferably includes, together with the compound represented by general formula (1), a compound represented by the following general formula (2):

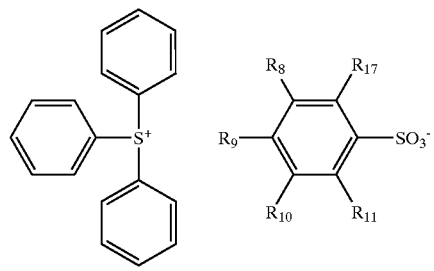

wherein $R_8$ and $R_{10}$ are the same or different and are selected from the group consisting of a hydrogen atom, a halogen atom, a nitro group and a trifluoromethyl group, at least one of which is not a hydrogen atom; and [[$R_7$,]] $R_9$, and $R_{11}$ and $R_{17}$ are the same or different and are a hydrogen atom or a halogen atom.

Examples of the halogen atom are a fluorine atom, a chlorine atom and a bromine atom.

Examples of the counter anion of the compound represented by general formula (2) are pentafluorobenzenesulfonate, 3-trifluoromethylbenzenesulfonate and 3,5-ditrifluoromethylbenzenesulfonate.

Typical examples of the compound represented by general formula (2) are triphenylsulfonium pentafluorobenzenesulfonate and triphenylsulfonium 3-trifluoromethylbenzenesulfonate.

Both the compounds represented by general formulas (1) and (2) generate sulfonic acid having a high degree of acidity, and hence, at least one electron attractive group (such as a halogen atom, a nitro group and a trifluoromethyl group) is introduced into the meta-position of the aromatic ring of the counter anion.

The cation of the compound represented by general formula (1) is substituted arylsulfonium in which an alkyl group is introduced into an aromatic ring. Therefore, the dissolution inhibiting effect against a developer is very high, so as to highly effectively prevent pattern collapse in a critical resolution region of the pattern. Also, the cation of the compound represented by general formula (2) is non-substituted arylsulfonium. Therefore, pattern collapse in a critical resolution region of the pattern can be highly effectively prevented.

Specific examples of the compound represented by general formula (1) are as follows, which do not limit the invention:

Diphenyl-4-methylphenylsulfonium pentafluorobenzenesulfonate; diphenyl-4-methylphenylsulfonium 2,5-dichlorobenzenesulfonate; diphenyl-4-methylphenylsulfonium 2,4,5-trichlorobenzenesulfonate; diphenyl-4-methylphenylsulfonium 3-nitrobenzenesulfonate; diphenyl-4-methylphenylsulfonium 3,5-dinitrobenzenesulfonate; diphenyl-4-methylphenylsulfonium 3-trifluoromethylbenzenesulfonate; diphenyl-4-methylphenylsulfonium 3,5-ditrifluoromethylbenzenesulfonate; diphenyl-2,4-dimethylphenylsulfonium pentafluorobenzenesulfonate; diphenyl-2,4-dimethylphenylsulfonium 2,5-dichlorobenzenesulfonate; diphenyl-2,4-dimethylphenylsulfonium 2,4,5-trichlorobenzenesulfonate; diphenyl-2,4-dimethylphenylsulfonium 3-nitrobenzenesulfonate; diphenyl-2,4-dimethylphenylsulfonium 3,5-dinitrobenzenesulfonate; diphenyl-2,4-dimethylphenylsulfonium 3-trifluoromethylbenzenesulfonate; diphenyl-2,4-dimethylphenylsulfonium 3,5-ditrifluoromethylbenzenesulfonate; diphenyl-2,4,6-trimethylphenylsulfonium pentafluorobenzenesulfonate; diphenyl-2,4,6-trimethylphenylsulfonium 2,5-dichlorobenzenesulfonate; diphenyl-2,4,6-trimethylphenylsulfonium 2,4,5-trichlorobenzenesulfonate; diphenyl-2,4,6-trimethylphenylsulfonium 3-nitrobenzenesulfonate; diphenyl-2,4,6-trimethylphenylsulfonium 3,5-dinitrobenzenesulfonate; diphenyl-2,4,6-trimethylphenylsulfonium 3-trifluoromethylbenzenesulfonate; diphenyl-2,4,6-trimethylphenylsulfonium 3,5-ditrifluoromethylbenzenesulfonate; diphenyl-4-ethylphenylsulfonium pentafluorobenzenesulfonate; diphenyl-4-ethylphenylsulfonium 2,5-dichlorobenzenesulfonate; diphenyl-4-ethylphenylsulfonium 3-trifluoromethylbenzenesulfonate; diphenyl-4-ethylphenylsulfonium 3,5-ditrifluoromethylbenzenesulfonate; diphenyl-4-n-propylphenylsulfonium pentafluorobenzenesulfonate; diphenyl-4-n-propylphenylsulfonium 3-trifluoromethylbenzenesulfonate; diphenyl-4-isopropylphenylsulfonium pentafluorobenzenesulfonate; diphenyl-4-isopropylphenylsulfonium 3-trifluoromethylbenzenesulfonate; diphenyl-4-n-butylphenylsulfonium pentafluorobenzenesulfonate; diphenyl-4-n-butylphenylsulfonium 3-trifluoromethylbenzenesulfonate; diphenyl-4-isobutylphenylsulfonium pentafluorobenzenesulfate; diphenyl-4-isobutylphenylsulfonium 3-trifluoromethylbenzenesulfonate; diphenyl-4-sec-butylphenylsulfonium pentafluorobenzenesulfonate; diphenyl-4-sec-butylphenylsulfonium 3-trifluoromethylbenzenesulfonate; diphenyl-4-tert-butylphenylsulfonium pentafluorobenzenesulfonate; diphenyl-4-tert-butylphenylsulfonium 2,5-dichlorobenzenesulfonate; diphenyl-4-tert-butylphenylsulfonium 2,4,5-trichlorobenzenesulfonate; diphenyl-4-tert-butylphenylsulfonium 3-nitrobenzenesulfonate; diphenyl-4-tert-butylphenylsulfonium 3,5-dinitrobenzenesulfonate; diphenyl-4-tert-butylphenylsulfonium 3-trifluoromethylbenzenesulfonate; diphenyl-4-tert-butylphenylsulfonium 3,5-ditrifluoromethylbenzenesulfonate; tris(4-methylphenyl)sulfonium pentafluorobenzenesulfonate; tris(4-methylphenyl)sulfonium 3-trifluoromethylbenzenesulfonate; tris(4-methylphenyl)sulfonium 3,5-di-trifluoromethylbenzenesulfonate; tris(4-ethylphenyl)sulfonium pentafluorobenzenesulfonate; tris(4-n-propylethylphenyl)sulfonium pentafluorobenzenesulfonate; tris(4-isopropylphenyl)sulfonium pentafluorobenzenesulfonate; tris(4-isopropylphenyl)sulfonium 3-trifluoromethylbenzenesulfonate; tris(4-isopropylphenyl)sulfonium 3,5-ditrifluoromethylbenzenesulfonate; bis(4-methylphenyl)phenylsulfonium pentafluorobenzenesulfonate; bis(4-methylphenyl)phenylsulfonium 2,5-dichlorobenzenesulfonate; bis(4-methylphenyl)phenylsulfonium 3-trifluoromethylbenzenesulfonate; and bis(4-methylphenyl)phenylsulfonium 3,5-ditrifluoromethylbenzenesulfonate.

Specific examples of the compound represented by general formula (2) are as follows, which do not limited the invention:

Triphenylsulfonium pentafluorobenzenesulfonate; triphenylsulfonium 2,5-dichlorobenzenesulfonate; triphenylsulfonium 2,4,5-trichlorobenzenesulfonate; triphenylsulfonium 3-nitrobenzenesulfonate; triphenylsulfonium 3,5-dinitrobenzenesulfonate; triphenylsulfonium 3-trifluoromethylbenzenesulfonate; and triphenylsulfonium 3,5-ditrifluoromethylbenzenesulfonate.

The compound represented by general formula (1) may be synthesized, for example, as follows:

A compound represented by the following general formula (7) is dissolved in a solvent of hydrocarbon halide, such as methylene chloride, methylene bromide, 1,2-dichloroethane and chloroform, a solvent of aromatic hydrocarbon, such as benzene, toluene and xylene, or a mixed solvent of any of these solvents and an ether such as ethyl ether, isopropyl ether, tetrahydrofuran and 1,2-dimethyl ethane.

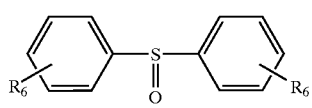

(7)

wherein $R_6$ is a hydrogen atom or a linear or branched alkyl group having a carbon number of 1 through 4.

To the resultant solution in which the compound represented by general formula (7) is dissolved in the solvent, a Grignard reagent represented by the following general formula (8) is added at a temperature of −10° C. through +100° C. The resultant solution is stirred at a temperature of 0° C. through 100° C. for 0.5 through 10 hours, so as to cause a reaction between the compound represented by general formula (7) and the Grignard reagent represented by general formula (8). The mixing ratio of the reagent represented by general formula (8) in the compound represented by general formula (7) is 0.5 through 3 in a molar ratio.

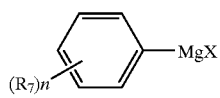

(8)

wherein $R_7$ is a hydrogen atom or a linear or branched alkyl group having a carbon number of 1 through 4; n is an integer of 1 through 3; and X is a halogen atom.

Next, when the reaction is completed, the obtained reaction solution is treated at a temperature of 0 through 30° C. with a hydroacid halide aqueous solution such as a hydrobromic acid aqueous solution, a hydrochloric acid aqueous solution and a hydroiodic acid aqueous solution. Thus, a compound represented by the following general formula (9) is obtained:

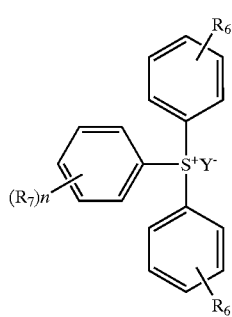

(9)

wherein $R_6$ and $R_7$ are the same or different and are a hydrogen atom or a linear or branched alkyl group having a carbon number of 1 through 4; n is an integer of 1 through 3; and Y is a halogen atom.

The compound represented by general formula (9) is dissolved in methylene chloride, methanol, ethanol, isopropanol, water or a mixed solvent of any of them. To the resultant solution, 0.9 through 1.5 mol of organic sulfonate is added, and the resultant solution is stirred at a temperature of 0 through 50° C. for 0.5 through 20 hours for causing a reaction. Thus, the compound represented by general formula (1) is obtained.

Also the compound represented by general formula (2) may be obtained in a similar manner.

The compound represented by general formula (1) generates a strong acid and has a very high dissolution inhibiting property against an alkaline developer. Alternatively, the compound represented by general formula (2) generates a strong acid and its dissolution inhibiting property against the alkaline developer is lower than that of the compound represented by general formula (1).

Accordingly, although the acid generator may singly include the compound represented by general formula (1) or (2), it preferably includes both of these compounds. The reasons is as follows:

When an acid generator including merely the compound represented by general formula (1) is used, pattern collapse tends to be caused in a critical resolution region. Also, when an acid generator including merely the compound represented by general formula (2) is used, pattern collapse tends to be caused and hence the resolution is limited.

However, when an acid generator including both the compound represented by general formula (1) and the compound represented by general formula (2) is used, the aforementioned problems can be overcome, so that high sensitivity and high resolution can be attained and that a pattern can be formed in a good shape.

In this case, the weight ratio of the compound represented by general formula (1) to the compound represented by general formula (2) is preferably 0.2 through 2.0 for the following reason: When the weight ratio of the compound represented by general formula (1) to the compound represented by general formula (2) exceeds 2.0, the sensitivity of the resist film is lowered and pattern collapse may be caused in forming a fine resist pattern. On the other hand, when the weight ratio of the compound represented by general formula (1) to the compound represented by general formula (2) is smaller than 0.2, the dissolution inhibiting property is lowered, and hence, a fine resist pattern may be collapsed to lower the resolution.

In consideration of these facts, in order to form a resist pattern in a good shape and to attain high sensitivity and high resolution by using both the compound represented by general formula (1) and the compound represented by general formula (2), the following compounds are particularly preferred to be used as these compounds:

Examples of the preferably used compound represented by general formula (1) are diphenyl-2,4,6-trimethylphenylsulfonium pentafluorobenzenesulfonate, diphenyl-2,4,6-trimethylphenylsulfonium 3-trifluoromethylbenzenesulfonate, diphenyl-2,4,6-trimethylphenylsulfonium 3,5-ditrifluoromethylbenzenesulfonate, diphenyl-2,4,6-trimethylphenylsulfonium 2,5-dichlorobenzenesulfonate, diphenyl-4-methylphenylsulfonium pentafluorobenzenesulfonate, diphenyl-4-methylphenylsulfonium 3-trifluoromethylbenzenesulfonate, diphenyl-4-methylphenylsulfonium 3,5-ditrifluoromethylbenzenesulfonate and diphenyl-4-methylphenylsulfonium 2,5-dichlorobenzenesulfonate, among which diphenyl-2,4,6-trimethylphenylsulfonium pentafluorobenzenesulfonate and diphenyl-4-methylphenylsulfonium pentafluorobenzenesulfonate are more preferred.

Also, examples of the preferably used compound represented by general formula (2) are triphenylsulfonium pentafluorobenzenesulfonate, triphenylsulfonium 3-trifluoromethylbenzenesulfonate, triphenylsulfonium 3,5-ditrifluoromethylbenzenesulfonate and triphenylsulfonium 2,5-dichlorobenzenesulfonate, among which triphenylsulfonium pentafluorobenzenesulfonate and triphenylsulfonium 3-trifluoromethylbenzenesulfonate are more preferred.

(Base polymer)

Now, the base polymer included in the chemically amplified resist material used in the pattern formation method of this embodiment will be described.

The base polymer preferably includes a first monomer unit represented by the following general formula (3), a second monomer unit represented by the following general formula (4) and a third monomer unit represented by the following general formula (5):

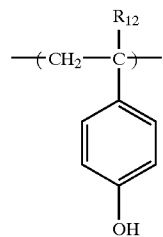
(3)

wherein $R_{12}$ is a hydrogen atom or a methyl group.

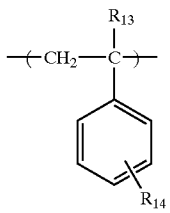
(4)

wherein $R_{13}$ is a hydrogen atom or a methyl group; and $R_{14}$ is a hydrogen atom or a linear or branched alkyl group having a carbon number of 1 through 4. Examples of the linear or branched alkyl group having a carbon number of 1 through 4 are a methyl group, an ethyl group, an n-propyl group, an isopropyl group, an n-butyl group, an isobutyl group, a sec-butyl group and a tert-butyl group.

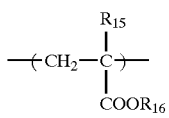
(5)

wherein $R_{15}$ is a hydrogen atom or a methyl group; and $R_{16}$ is a protecting group. Examples of the protecting group are a tert-butyl group, a tert-pentyl group, a 1-methylcyclohexyl group, a tetrahydropyranyl group, a tetrahydrofuranyl group, a 1-adamantyl group, a 2-methyl-2-adamantyl group, a 4-methyl-2-oxo-4-tetrahydropyranyl group (a mevalonic lactonyl group), a β-hydroxy-β-methyl-δ-valerolactonyl group, a triphenylmethyl group, a 1,1-diphenylethyl group, and a 2-phenyl-2-propyl group.

Examples of the first monomer unit represented by general formula (3) are p-hydroxystyrene and p-hydroxy-α-methylstyrene.

Examples of the second monomer unit represented by general formula (4) are styrene, p-methylstyrene, m-methylstyrene, p-ethylstyrene, p-n-propylstyrene, p-isopropylstyrene, p-n-butylstyrene, p-isobutylstyrene, p-sec-butylstyrene and p-tert-butylstyrene.

Examples of the third monomer unit represented by general formula (5) are tert-butyl acrylate, tert-pentyl acrylate, 1-methylcyclohexyl acrylate, tetrahydrofuranyl acrylate, tetrahydrofuranyl acrylate, 1-adamantyl acrylate, 2-methyl-2-adamantyl acrylate, 4-methyl-4-oxo-4-tetrahydropyranyl acrylate, triphenylmethyl acrylate, 1,1-diphenylethyl acrylate, 2-phenyl-2-propyl acrylate, tert-butyl methacrylate, tert-pentyl methacrylate, 1-methylcyclohexyl methacrylate, tetrahydropyranyl methacrylate, tetrahydrofuranyl methacrylate, 1-adamantyl methacrylate, 2-methyl-2-adamantyl methacrylate, 4-methyl-2-oxo-4-trahydropyranyl methylacrylate, triphenylmethyl methacrylate, 1,1-diphenylethyl methacrylate and 2-phenyl-2-propyl methacrylate.

An example of the base polymer including the first monomer unit represented by general formula (3), the second monomer unit represented by general formula (4) and the third monomer unit represented by general formula (5) is a compound represented by the following general formula (6):

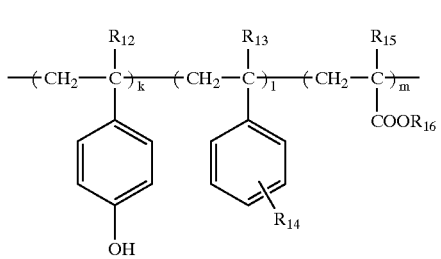
(6)

wherein $R_{12}$ is a hydrogen atom or a methyl group; $R_{13}$ is a hydrogen atom or a methyl group; $R_{14}$ is a hydrogen atom or a linear or branched alkyl group having a carbon number of 1 through 4; $R_{15}$ is a hydrogen atom or a methyl group; $R_{16}$ is a protecting group; and k, l and m are positive integers satisfying $0.25 \geq l/(k+l+m) \geq 0.10$ and $0.20 \leq m/(k+l+m) \leq 0.07$.

Specific examples of the polymer represented by general formula (6) are as follows, which do not limit the invention; and any of the following polymers may be used singly or in combination:

Poly(p-hydroxystyrene/styrene/tert-butyl acrylate), poly(p-hydroxystyrene/styrene/tert-pentyl acrylate), poly(p-hydroxystyrene/styrene/1-methylcyclohexyl acrylate), poly(p-hydroxystyrene/styrene/tetrahydropyranyl acrylate), poly(p-hydroxystyrene/styrene/1-adamantyl acrylate), poly(p-hydroxystyrene/styrene/2-methyl-2-adamantyl acrylate), poly(p-hydroxystyrene/styrene/4-methyl-2-oxo-4-tetrahydropyranyl acrylate), poly(p-hydroxystyrene/styrene/triphenylmethyl acrylate), poly(p-hydroxystyrene/styrene/1,1-diphenylethyl acrylate), poly(p-hydroxystyrene/styrene/2-phenyl-2-propyl acrylate), poly(p-hydroxy-α-methylstyrene/styrene/tert-butyl acrylate), poly(p-hydroxy-α-methylstyrene/styrene/tert-pentyl acrylate), poly(p-hydroxystyrene/styrene/tert-butyl methacrylate), poly(p-hydroxystyrene/styrene/tert-pentyl methacrylate), poly(p-hydroxystyrene/styrene/1-methylcyclohexyl methacrylate), poly(p-hydroxystyrene/styrene/tetrahydropyranyl methacrylate), poly(p-hydroxystyrene/styrene/1-admantyl methacrylate), poly(p-hydroxystyrene/styrene/2-methyl-2-adamantyl methacrylate), poly(p-hydroxystyrene/styrene/4-methyl-2-oxo-4-tetrahydropyranyl methacrylate), poly(p-hydroxystyrene/styrene/triphenylmethyl methacrylate), poly(p-hydroxystyrene/styrene/1,1-diphenylethyl methacrylate), poly(p-hydroxystyrene/styrene/2-phenyl-2-propyl methacrylate), poly(p-hydroxy-α-methylstyrene/styrene/tert-butyl methacrylate), poly(p-hydroxy-α-methylstyrene/styrene/tert-pentyl methacrylate), poly(p-hydroxystyrene/p-methylstyrene/tert-butyl acrylate), poly(p-hydroxystyrene/m-methylstyrene/tert-butyl acrylate), poly(p-hydroxystyrene/p-methylstyrene/tert-pentyl acrylate), poly(p-hydroxystyrene/m-methylstyrene/tert-pentyl acrylate), poly(p-hydroxystyrene/p-methylstyrene/1-methylcyclohexyl acrylate), poly(p-hydroxystyrene/m-methylstyrene/1-methycyclohexyl acrylate), poly(p-hydroxystyrene/p-methylstyrene/tetrahydropyranyl acrylate), poly(p-hydroxystyrene/p-methylstyrene/1-adamantyl acrylate), poly(p-hydroxystyrene/m-methylstyrene/1-adamantyl acrylate), poly(p-hydroxystyrene/p-methylstyrene/2-methyl-2-adamantyl acrylate), poly(p-hydroxystyrene/m-methylstyrene/2-methyl-2-admantyl acrylate), poly(p-hydroxystyrene/p-methylstyrene/4-methyl-2-oxo-4-tetrahydropyranyl acrylate), poly(p-hydroxystyrene/m-methylstyrene/4-methyl-2-oxo-4-tetrahydropyranyl acrylate), poly(p-hydroxystyrene/p-methylstyrene/triphenylmethyl acrylate), poly(p-hydroxystyrene/p-methylstyrene/1,1-diphenylethyl acrylate), poly(p-hydroxystyrene/p-methylstyrene/2-phenyl-2-propyl acrylate), poly(p-hydroxy-α-methylstyrene/p-methylstyrene/tert-butyl acrylate), poly(p-hydroxy-α-methylstyrene/p-methylstyrene/tert-pentyl acrylate), poly(p-hydroxystyrene/p-methylstyrene/tert-butyl methacrylate), poly(p-hydroxystyrene/m-methylstyrene/tert-butyl methacrylate), poly(p-hydroxystyrene/p-methylstyrene/tert-pentyl methacrylate), poly(p-hydroxystyrene/m-methylstyrene/tert-pentyl methacrylate), poly(p-hydroxystyrene/p-methylstyrene/1-methylcyclohexyl methacrylate), poly(p-hydroxystyrene/m-methylstyrene/1-methycyclohexyl methacrylate), poly(p-hydroxystyrene/p-methylstyrene/tetrahydropyranyl methacrylate), poly(p-hydroxystyrene/p-methylstyrene/1-adamantyl methacrylate), poly(p-hydroxystyrene/m-methylstyrene/1-adamantyl methacrylate), poly(p-hydroxystyrene/p-methylstyrene/2-methyl-2-adamantyl methacrylate), poly(p-hydroxystyrene/m-methylstyrene/2-methyl-2-adamantyl methacrylate), poly(p-hydroxystyrene/p-methylstyrene/4-methyl-2-oxo-4-tetrahydropyranyl methacrylate), poly(p-hydroxystyrene/m-methylstyrene/4-methyl-2-oxo-4-tetrahydropyranyl methacrylate), poly(p-hydroxystyrene/p-methylstyrene/triphenylmethyl methacrylate), poly(p-hydroxystyrene/p-methylstyrene/1,1-diphenylethyl methacrylate), poly(p-hydroxystyrene/p-methylstyrene/2-phenyl-2-propyl methacrylate), poly(p-hydroxy-α-methylstyrene/p-methylstyrene/tert-butyl methacrylate), poly(p-hydroxy-α-methylstyrene/p-methylstyrene/tert-pentyl methacrylate), poly(p-hydroxystyrene/p-ethylstyrene/tert-butyl acrylate), poly(p-hydroxystyrene/p-ethylstyrene/tert-pentyl acrylate), poly(p-hydroxystyrene/p-ethylstyrene/1-methylcyclohexyl acrylate), poly(p-hydroxystyrene/p-ethylstyrene/1-adamantyl acrylate), poly(p-hydroxystyrene/p-ethylstyrene/2-methyl-2-adamantyl acrylate), poly(p-hydroxystyrene/p-ethylstyrene/4-methyl-2-oxo-4-tetrahydropyranyl acrylate), poly(p-hydroxy-α-methylstyrene/p-ethylstyrene/tert-butyl acrylate), poly(p-hydroxy-α-methylstyrene/p-ethylstyrene/tert-pentyl acrylate), poly(p-hydroxystyrene/p-ethylstyrene/tert-butyl methacrylate), poly(p-hydroxystyrene/p-ethylstyrene/tert-pentyl methacrylate), poly(p-hydroxystyrene/p-ethylstyrene/1-methylcyclohexyl methacrylate), poly(p-hydroxystyrene/p-ethylstyrene/1-admanatyl methacrylate), poly(p-hydroxystyrene/p-ethylstyrene/2-methyl-2-admantyl methacrylate), poly(p-hydroxystyrene/p-ethylstyrene/4-methyl-2-oxo-4-tetrahydropyranyl methacrylate), poly(p-hydroxy-α-methylstyrene/p-ethylstyrene/tert-butyl methacrylate), poly(p-hydroxy-α-methylstyrene/p-ethylstyrene/tert-pentyl methacrylate), poly(p-hydroxystyrene/p-n-propylstyrene/tert-butyl acrylate), poly(p-hydroxystyrene/p-n-propylstyrene/tert-pentyl acrylate), poly(p-hydroxystyrene/p-n-propylstyrene/1-methycyclohexyl acrylate), poly(p-hydroxystyrene/p-n-propylstyrene/1-adamantyl acrylate), poly(p-hydroxystyrene/p-n-propylstyrene/2-methyl-2-adamantyl acrylate), poly(p-hydroxystyrene/p-n-propylstyrene/4-methyl-2-oxo-4-tetrahydropyranyl acrylate), poly(p-hydroxy-α-methylstyrene/p-n-propylstyrene/tert-butyl acrylate), poly(p-hydroxy-α-methylstyrene/p-n-propylstyrene/tert-pentyl acrylate), poly(p-hydroxystyrene/p-n-propylstyrene/tert-butyl methacrylate), poly(p-hydroxystyrene/p-n-propylstyrene/tert-pentyl methacrylate), poly(p-hydroxystyrene/p-n-propylstyrene/1-methylcyclohexyl methacrylate), poly(p-hydroxystyrene/p-n-propylstyrene/1-admantyl methacrylate), poly(p-hydroxystyrene/p-n-propylstyrene/2-methyl-2-adamantyl methacrylate), poly(p-hydroxystyrene/p-n-propylstyrene/4-methyl-2-oxo-4-tetrahydropyranyl methacrylate), poly(p-hydroxy-α-methylstyrene/p-n-propylstyrene/tert-butyl methacrylate), poly(p-hydroxy-α-methylstyrene/p-n-propylstyrene/tert-pentyl methacrylate), poly(p-hydroxystyrene/p-isopropylstyrene/tert-butyl acrylate), poly(p-hydroxystyrene/p-isopropylstyrene/tert-pentyl acrylate), poly(p-hydroxystyrene/p-isopropylstyrene/1-methylcyclohexyl acrylate), poly(p-hydroxystyrene/p-isopropylstyrene/1-adamantyl acrylate), poly(p-hydroxystyrene/p-isopropylstyrene/2-methyl-2-adamantyl acrylate), poly(p-hydroxystyrene/p-isopropylstyrene/4-methyl-2-oxo-4-tetrahydropyranyl acrylate), poly(p-hydroxy-α-methylstyrene/p-isopropylstyrene/tert-butyl acrylate), poly(p-hydroxy-α-methylstyrene/p-isopropylstyrene/tert-pentyl acrylate), poly(p-hydroxystyrene/p-isopropylstyrene/tert-butyl methacrylate), poly(p-hydroxystyrene/p-isopropylstyrene/tert-pentyl methacrylate), poly(p-hydroxystyrene/p-isopropylstyrene/1-methycyclohexyl methacrylate), poly(p-hydroxystyrene/p-isopropylstyrene/1-adamantyl methacrylate), poly(p-hydroxystyrene/p-isopropylstyrene/2-methyl-2-adamantyl methacrylate), poly(p-hydroxystyrene/p-isopropylstyrene/4-methyl-2-oxo-4-tetrahydropyranyl methacrylate), poly(p-hydroxy-α-methylstyrene/p-isopropylstyrene/tert-butyl methacrylate), poly(p-hydroxy-α-methylstyrene/p-isopropylstyrene/tert-pentyl methacrylate), poly(p-hydroxystyrene/p-n-butylstyrene/tert-butyl acrylate), poly(p-hydroxystyrene/p-n-butylstyrene/tert-pentyl acrylate), poly(p-hydroxystyrene/p-n-butylstyrene/1-methylcyclohexyl acrylate), poly(p-hydroxystyrene/p-n-butylstyrene/1-adamantyl acrylate), poly(p-hydroxystyrene/p-n-butylstyrene/2-methyl-2-admantyl acrylate), poly(p-hydroxystyrene/p-n-butylstyrene/4-methyl-2-oxo-4-tetrahydropyranyl acrylate), poly(p-hydroxystyrene/p-n-butylstyrene/tert-butyl methacrylate), poly(p-hydroxystyrene/p-n-butylstyrene/tert-pentyl methacrylate), poly(p-hydroxystyrene/p-n-butylstyrene/1-methylcyclohexyl methacrylate), poly(p-hydroxystyrene/p-n-butylstyrene/1-admantyl methacrylate), poly(p-hydroxystyrene/p-n-butylstyrene/2-methyl-2-adamantyl methacrylate), poly(p-hydroxystyrene/p-n-butylstyrene/4-methyl-2-oxo-4-tetrahydropyranyl methacrylate), poly(p-hydroxystyrene/p-isobutylstyrene/tert-butyl acrylate), poly(p-hydroxystyrene/p-isobutylstyrene/tert-pentyl acrylate), poly(p-hydroxystyrene/p-isobutylstyrene/1-methylcyclohexyl acrylate), poly(p-hydroxystyrene/p-isobutylstyrene/1-adamantyl acrylate), poly(p-hydroxystyrene/p-isobutylstyrene/2-methyl-2-adamantyl acrylate), poly(p-hydroxystyrene/p-isobutylstyrene/4-methyl-2-oxo-4-tetrahydropyranyl acrylate), poly(p-hydroxystyrene/p-isobutylstyrene/tert-butyl methacrylate), poly(p-hydroxystyrene/p-isobutylstyrene/tert-pentyl methacrylate), poly(p-hydroxystyrene/p-isobutylstyrene/ methycyclohexyl methacrylate), poly(p-hydroxystyrene/p-isobutylstyrene/adamantyl methacrylate), poly(p-hydroxystyrene/p-isobutylstyrene/2-methyl-2-adamantyl methacrylate), poly(p-hydroxystyrene/p-isobutylstyrene/4-methyl-2-oxo-4-tetrahydropyranyl methacrylate), poly(p-hydroxystyrene/p-sec-butylstyrene/tert-butyl acrylate), poly(p-hydroxystyrene/p-sec-butylstyrene/tert-pentyl acrylate), poly(p-hydroxystyrene/p-sec-butylstyrene/1-methylcyclohexyl acrylate) poly(p-hydroxystyrene/p-sec-butylstyrene/1-adamantyl acrylate), poly(p-hydroxystyrene/p-sec-butylstyrene/2-methyl-2-adamantyl acrylate), poly(p-hydroxystyrene/p-sec-butylstyrene/4-methyl-2-oxo-4-tetrahydropyranyl acrylate), poly(p-hydroxystyrene/p-sec-butylstyrene/tert-butyl methacrylate), poly(p-hydroxystyrene/p-sec-butylstyrene/tert-pentyl methacrylate), poly(p-hydroxystyrene/p-sec-butylstyrene/1-methylcyclohexyl methacrylate), poly(p-hydroxystyrene/p-sec-butylstyrene/1-adamantyl methacrylate), poly(p-hydroxystyrene/p-sec-butylstyrene/2-methyl-2-admanatyl methacrylate), poly(p-hydroxystyrene/p-sec-butylstyrene/4-methyl-2-oxo-4-tetrahydropyranyl methacrylate), poly(p-hydroxystyrene/p-tert-butylstyrene/tert-butyl acrylate), poly(p-hydroxystyrene/p-tert-butylstyrene/tert-pentyl acrylate), poly(p-hydroxystyrene/p-tert-butylstyrene/1-methylcyclohexyl acrylate), poly(p-hydroxystyrene/p-tert-butylstyrene/1-adamantyl acrylate), poly(p-hydroxystyrene/p-tert-butylstyrene/2-methyl-2-admantyl acrylate), poly(p-hydroxystyrene/p-tert-butylstyrene/4-methyl-2-oxo-4-tetrahydropyranyl acrylate), poly(p-hydroxystyrene/p-tert-butylstyrene/triphenylmethyl acrylate), poly(p-hydroxystyrene/p-tert-butylstyrene/1,1-diphenylethyl acrylate), poly(p-hydroxystyrene/p-tert-butylstyrene/2-phenyl-2-propyl acrylate), poly(p-hydroxy-α-methylstyrene/p-tert-butylstyrene/tert-butyl acrylate), poly(p-hydroxy-α-methylstyrene/p-tert-butylstyrene/-tert-pentyl acrylate), poly(p-hydroxystyrene/p-tert-butylstyrene/tert-butyl methacrylate), poly(p-hydroxystyrene/p-tert-butylstyrene/-tert-pentyl methacrylate), poly(p-hydroxystyrene/p-tert-butylstyrene/1-methylcyclohexyl methacrylate), poly(p-hydroxystyrene/p-tert-butylstyrene/1-adamantyl methacrylate), poly(p-hydroxystyrene/p-tert-butylstyrene/2-methyl-2-admanatyl methacrylate), poly(p-hydroxystyrene/p-tert-butylstyrene/β-hydroxy-β-methyl-δ-valerolactonyl methacrylate), poly(p-hydroxystyrene/p-tert-butylstyrene/triphenylmethyl methacrylate), poly(p-hydroxystyrene/p-tert-butylstyrene/1,1-diphenylethyl methacrylate), poly(p-hydroxystyrene/p-tert-butylstyrene/2-phenyl-2-propyl methacrylate), poly(p-hydroxy-α-methylstyrene/p-tert-butylstyrene/tert-butyl methacrylate), and poly(p-hydroxy-α-methylstyrene/p-tert-butylstyrene/tert-pentyl methacrylate).

Among the aforementioned polymers, the following polymers are particularly good for attaining high resolution and etching resistance. Any of the following polymers may be used singly or in combination:

Poly(p-hydroxystyrene/styrene/tert-butyl acrylate), poly(p-hydroxystyrene/styrene/1-methylcyclohexyl acrylate), poly(p-hydroxystyrene/styrene/1-adamantyl acrylate), poly(p-hydroxystyrene/styrene/2-methyl-2-adamantyl acrylate), poly(p-hydroxystyrene/styrene/β-hydroxy-β-methyl-δ-valerolactonyl acrylate), poly(p-hydroxystyrene/p-methylstyrene/tert-butyl acrylate), poly(p-hydroxystyrene/m-methylstyrene/tert-butyl acrylate), poly(p-hydroxystyrene/p-methylstyrene/1-methylcyclohexyl acrylate), poly(p-hydroxystyrene/m-methylstyrene/1-methylcyclohexyl acrylate), poly(p-hydroxystyrene/p-methylstyrene/1-adamantyl acrylate), poly(p-hydroxystyrene/m-methylstyrene/1-adamantyl acrylate), poly(p-hydroxystyrene/p-methylstyrene/2-methyl-2-adamantyl acrylate), poly(p-hydroxystyrene/m-methylstyrene/2-methyl-2-adamantyl acrylate), poly(p-hydroxystyrene/p-methylstyrene/β-hydroxy-β-methyl-δ-valerolactonyl acrylate), poly(p-hydroxystyrene/m-methylstyrene/β-hydroxy-β-methyl-δ-valerolactonyl acrylate), poly(p-hydroxystyrene/p-tert-butylstyrene/tert-butyl acrylate), poly(p-hydroxystyrene/p-tert-butylstyrene/1-methylcyclohexyl acrylate), poly(p-hydroxystyrene/p-tert-butylstyrene/1-adamantyl acrylate), poly(p-hydroxystyrene/p-tert-butylstyrene/2-methyl-2-adamantyl acrylate), and poly(p-hydroxystyrene/p-tert-butylstyrene/β-hydroxy-β-methyl-δ-valerolactonyl acrylate, among which poly(p-hydroxystyrene/styrene/tert-butyl acrylate), poly(p-hydroxystyrene/styrene/1-adamantyl acrylate), poly(p-hydroxystyrene/p-methylstyrene/tert-butyl acrylate), poly(p-hydroxystyrene/p-methylstyrene/1-adamantyl acrylate), poly(p-hydroxystyrene/m-methylstyrene/tert-butyl acrylate) and poly(p-hydroxystyrene/m-methylstyrene/1-adamantyl acrylate) are more preferred.

The polymer represented by general formula (6) is synthesized as follows:

First, the first monomer unit represented by general formula (3), the second monomer unit represented by general formula (4) and the third monomer unit represented by general formula (5) are dissolved in an appropriate solvent, such as toluene, 1,4-dioxane, tetrahydrofuran, isopropanol and methyl ethyl ketone, in a volume 1 through 10 times as large as that of the monomers, so as to give a solution.

The resultant solution is allowed to react in a stream of nitrogen at a temperature of 50 through 150° C. for 1 through 20 hours in the presence of a polymerization initiator, such as azoisobutyronitrile, 2,2'-azobis(2,4-dimethylvaleronitrile), 2,2'-azobis(methyl-2-methylpropionate), 2,2'-azobis(2-methylbutyronitrile), benzoyl peroxide and lauroyl peroxide, in an amount of 0.1 through 30 wt % based on the monomers. Thereafter, the resultant reaction product is treated by a general method for taking out a polymer. Thus, the polymer represented by general formula (6) can be obtained.

The weight-average molecular weight (Mw) of the polymer represented by general formula (6) is generally 3,000 through 50,000, preferably 5,000 through 25,000 and more preferably 5,000 through 20,000. Also, the degree of dispersion (Mw/Mn) is generally 1.0 through 3.5 and preferably 1.0 through 2.5.

(Solvent)

Now, the solvent included in the chemically amplified resist material used in the pattern formation method of this embodiment will be described.

Specific examples of the solvent are as follows, which do not limit the invention:

Methyl cellosolve acetate, ethyl cellosolve acetate, propylene glycol monomethyl ether, propylene glycol monomethyl ether acetate, propylene glycol monoethyl ether acetate, methyl lactate, ethyl lactate, propyl lactate, 2-ethoxyethyl lactate, methyl pyruvate, ethyl pyruvate, methyl 3-methoxypropionate, ethyl 3-methoxypropionate, N,N-dimethylformamide, N,N-dimethylacetamide, cyclohexane, methyl ethyl ketone, 2-heptanone, β-propiolactone, β-butyrolactone, γ-butyrolactone, γ-valerolactone, δ-valerolactone, 1,4-dioxane, diethylene glycol monomethyl ether, diethylene glycol dimethyl ether, ethylene glycol monoisopropyl ether, and N-methyl-2-pyrrolidone.

One of these solvents may be used singly or two or more of them may be used in combination.

In using any resist material, the amount of the solvent is generally 3 through 40 times and preferably 7 through 20 times as heavy as that of all solids constituents.

(Organic basic compound)

Now, the organic basic compound included in the chemically amplified resist material used in the pattern formation method of this embodiment will be described.

Specific examples of the organic basic compound, added for the purpose of adjusting sensitivity or the like, are as follows, which do not limit the invention:

Pyridine, picoline, triethylamine, tri-n-butylamine, tri-n-octylamine, dioctylmethylamine, dicyclohexylmethylamine, N-methylpyrrolidine, N-methylpiperidine, triethanolamine, triisopropanolamine, dimethyldodecylamine, dimethylhexadecylamine, tribenzylamine, tris[2-(2-methoxyethoxy)ethyl]amine, tetramethylammonium hydroxide, tetraethylammonium hydroxide, tetra-n-butylammounium hydroxide, polyvinylpyridine, and poly(vinylpyridine/methyl methacrylate). One of these basic compounds may be singly used or two or more of them may be used in combination.

In using any resist material, the amount of the organic basic compound is generally 0.000001 through 1 wt % and preferably 0.00001 through 0.5 wt % on the basis of the total weight of the polymers.

(Surface active agent)

Now, the surface active agent added, if necessary, to the chemically amplified resist material used in the pattern formation method of this embodiment will be described.

Specific examples of the surface active agent are as follows, which do not limit the invention.

A fluorine-containing nonionic surface active agent such as Florard (trade name; manufactured by Sumitomo 3M Ltd.), Surfron (trade name; manufactured by Asahi Glass Co., Ltd.), Unidine (trade name; manufactured by Daikin Industries, Ltd.), Megafac (trade name; manufactured by Dainippon Ink and Chemicals, Inc.), Eftop (trade name; manufactured by Tohchem Co. Ltd.); polyethylene glycol; polypropylene glycol; and polyoxyethylene cetyl ether.

In using any resist material, the amount of the surface active agent added if necessary is generally 0.000001 through 1 wt % and preferably 0.00001 through 0.5 wt % on the basis of the total weight of the polymer.

Synthesis Example 1 of Base Polymer

Now, an example of the synthesis of poly(p-hydroxystyrene/styrene/tert-butyl acrylate), that is, the base polymer represented by general formula (6), will be described.

First, a raw material including p-hydroxystyrene (84.1 g) styrene (20.8 g) and tert-butyl acrylate (12.8 g) is dissolved in isopropanol (400 mL). Thereafter, azobisisobutyronitrile (14.1 g) is added to the resultant solution, and a reaction is caused in a stream of nitrogen at a temperature of 80° C. for 6 hours.

Next, the resultant reaction product is poured into water (10 L) so as to precipitate. The thus obtained deposit crystal is filtered and dried under reduced pressure to give a slightly brown powder crystal (95 g) of poly(p-hydroxystyrene/styrene/tert-butyl acrylate). The composition ratios in this copolymer measured by the $^{13}$C-NMR method are 7:2:1 (=a p-hydroxystyrene unit: a styrene unit: a tert-butyl acrylate unit). Also, the weight-average molecular weight (Mw) of the copolymer measured by the gel permeation chromatography on the basis of polystyrene is approximately 10,000, and the degree of dispersion (Mw/Mn) is approximately 1.9.

Synthesis Example 2 of Base Polymer

Now, an example of the synthesis of poly(p-hydroxystyrene/p-methylstyrene/ tert-butyl acrylate), that is, the base polymer represented by general formula (6), will be described.

First, a raw material similar to that of the synthesis example 1 but including p-methylstyrene (23.6 g) instead of styrene (20.8 g) is subjected to similar synthesis and post-treatment to those of the synthesis example 1, so as to give a slightly brown powder crystal (96 g) of poly(p-hydroxystyrene/p-methylstyrene/tert-butyl acrylate). The composition ratios in this copolymer measured by the $^{13}$C-NMR method are 7:2:1 (=a p-hydroxystyrene unit: a p-methylstyrene unit: a tert-butyl acrylate unit). Also, the weight-average molecular weight (Mw) of the copolymer measured by the gel permeation chromatography on the basis of polystyrene is approximately 10,500, and the degree of dispersion (Mw/Mn) is approximately 1.85.

Synthesis Example 3 of Base Polymer

Now, an example of the synthesis of poly(p-hydroxystyrene/styrene/1-adamantyl acrylate), that is, the base polymer represented by general formula (6), will be described.

First, p-hydroxystyrene (87.7 g), styrene (18.7 g) and 1-adamantyl acrylate (18.6 g) are dissolved in isopropanol (400 mL). Thereafter, 2,2'-azobis(methyl 2-methylpropyonate) (trade name: V-601; manufactured by Wako Pure Chemical Industries, Ltd.) (10.0 g) is added to the resultant solution, and a reaction is caused in a stream of nitrogen at a temperature of 80° C. for 6 hours.

Next, the resultant reaction product is poured into water (10 L) so as to precipitate, and the thus obtained deposit crystal is filtered and dried under reduced pressure to give a slightly brown powder crystal (100 g) of poly(p-hydroxystyrene/styrene/1-adamantyl acrylate). The composition ratios in this copolymer measured by the $^{13}$C-NMR method are 73:18:9 (=a p-hydroxystyrene unit: a styrene unit: a 1-adamantyl acrylate unit). Also, the weight-average molecular weight (Mw) of the copolymer measured by the gel permeation chromatography on the basis of polystyrene is approximately 9,800, and the degrees of dispersion (Mw/Mn) is approximately 1.80.

Synthesis Example 1 of Acid Generator

Now, an example of the synthesis of diphenyl-2,4,6-trimethylphenylsulfonium pentafluorobenzenesulfonate, that is, the compound represented by general formula (1), will be described.

(First stage)

First, diphenyl sulfoxide (24.0 g) is dissolved in tetrahydrofuran (600 mL) in an atmosphere of nitrogen, and chlorotrimethylsilane (31.5 g) is poured into the resultant solution. Then, a Grignard reagent obtained by a general method from 2-bromomesitylene (60 g) and magnesium (4.70 g) is added dropwise to the resultant solution cooled with ice, and a reaction is caused for 3 hours at the same temperature. After completing the reaction, a 24% hydrobromic acid aqueous solution (480 mL) is added dropwise to the reaction solution at a temperature of 0 through 5° C. Thereafter, toluene (600 mL) is poured into the resultant solution and the solution is stirred. Next, the stirred reaction solution is separated, and an organic layer is extracted with a 12% hydrobromic acid aqueous solution (120 mL) twice from the separated solution. Then, an organic layer is extracted with methylene chloride (480 mL) three times from the extracted organic layer. The thus obtained organic layer is dried with anhydrous magnesium sulfate, and the resultant is concentrated under reduced pressure to give white crystals (22.0 g) of diphenyl-2,4,6-trimethylphenylsulfonium bromide. The characteristics of this white crystals are as follows:

Melting point: 199 through 200° C.

1HNMR (CDCl3) δ ppm: 2.36 (6H ×2), 2.43 (3H, s, CH3), 7.21 (2H, 7.69–7.74 (4H, m, Ar-H), 7.75–7.79 (6H, m, Ar-H)

(Second stage)

The white crystal (19.3 g; 0.05 mol) of diphenyl-2,4,6-trimethylphenylsulfonium bromide obtained at the first stage is dissolved in methanol (100 mL), and a salt of tetramethylammonium pentafluorobenzenesulfonate (20.9 g; 0.065 mol) is added to the resultant solution. Thereafter, the obtained solution is stirred for 4 hours at room temperature so as to cause a reaction. After the reaction is completed, the obtained reaction solution is concentrated to give a residue, water (100 mL) and methylene chloride (100 mL) are poured into the residue, and the resultant solution is stirred and then allowed to stand. Next, an organic layer is separated, washed with water (once with 100 mL of water and once with 50 mL of water), and dried with anydrous MgSO$_4$. After filtering out the desiccant, the resultant is concentrated under reduced pressure, so as to give white crystal (26.8 g) of diphenyl-2,4,6-trimethylphenylsulfonium pentafluorobenzenesulfonate. The characteristics of the obtained white crystals are as follows:

Melting point: 132 through 133° C.

1HNMR (CDCl3) δ ppm: 2.31 (6H, s, CH3×2), 2.41 (3H, s, CH3), 7.08 (2H, s Ar-H) 7.50–7.51 (4H, s, Ar-H), 7.63–7.82 (6H, m, Ar-H)

Synthesis Example 2 of Acid Generator

Now, an example of the synthesis of triphenylsulfonium pentafluorobenzenesulfonate, that is, the compound represented by general formula (1), will be described.

(First stage)

A white crystal (20.2 g) of triphenylsulfonium bromide is obtained through a reaction and a post-treatment the same as those of the first stage of the synthesis example 1 of the acid generator except that 2-bromomethylene used at the first stage of the synthesis example 1 is replaced with bromobenzene (47.3 g). The characteristics of the obtained white crystal are as follows:

Melting point: 288 through 290° C.

1HNMR (CDCl3) δ ppm: 7.72–7.89 (I5H, m, Ar-H)

(Second stage)

The triphenylsulfonium bromide (17.2 g) obtained at the first stage and a salt of tetramethylammonium pentafluorobenzenesulfonate (20.9 g; 0.065 mol) are used for performing a reaction and a post-treatment the same as those of the second stage of the synthesis example 1, to give a colorless viscous oily substance (19.1 g) of triphenylsulfonium pentafluorobenzenesulfonate. The characteristics of the obtained colorless viscous oily substance are as follows:

1HNMR (CDCl3) δ ppm: 7.25–7.80 (15H, m, Ar-H)

Synthesis Examples 3 Through 8 of Acid Generator

A variety of acid generators are synthesized in a method similar to the synthesis example 1 of the acid generator. The physical properties of compounds respectively obtained by the synthesis examples 3 through 8 are listed in Table 1 below.

TABLE 1

| Synthesis Example | Compound | Appearance and Melting point | 1HNMR(CDDl3) δ ppm |
|---|---|---|---|
| 3 | Diphenyl-2,4,6-trimethylphenylsulfonium 2,5-dichlorobenzenesulfonate | Slightly yellow viscous oily substance | 2.30(6H, s, CH$_3$×2), 2.40(3H, s, CH$_3$), 7.13–7.29(4H, m, Ar—H), 7.62–7.71 (10H, m, Ar—H), 8.02(1H, s, Ar—H) |
| 4 | Diphenyl-2,4,6-trimethylphenylsulfonium 3-trifluoromethylbenzenesulfonate | Colorless scaly crystal (recrystallized from acetone) | 2.31(6H, s, CH$_3$×2), 2.40(3H, s, CH$_3$), 7.17(2H, s, Ar—H), 7.37–7.39(1H, d, Ar—H), 7.48–7.50 (1H, d, Ar—H), 7.62–7.73(10H, m, Ar—H), 8.05–8.07 (1H, d, Ar—H), 8.13 (1H, s, Ar—H) |
| 5 | Diphenyl-2,4,6-trimethylphenylsulfonium 3-nitrobenzenesulfonate | Slightly yellow viscous oily substance | 2.33(6H, s, CH$_3$×2), 2.41(3H, s, CH$_3$), 7.19(2H, s, Ar—H), 7.43–7.47(1H, t, Ar—H), 7.63–7.75 (10H, m, Ar—H), 8.03–8.10(2H, d, Ar—H), 8.23–8.25 (1H, d, Ar—H), 8.64 (1H, s, Ar—H) |
| 6 | Triphenylsulfonium 2,5-dichlorobenzenesulfonate | Slightly yellow crystal | |
| 7 | Triphenylsulfonium 3,5-di-trifluoromethylbenzenesulfonate | White crystal 127–128° C. | 7.61–7.69(16H, m, Ar—H), 8.36(2H, s, Ar—H) |

TABLE 1-continued

| Synthesis Example | Compound | Appearance and Melting point | 1HNMR(CDDl3) δ ppm |
|---|---|---|---|
| 8 | Diphenyl-4-methylphenylsulfonium Pentafluorobenzenesulfonate | Colorless viscous oily substance | 2.47(3H, s, CH$_3$), 7.48–7.50(2H, d, Ar—H), 7.66–7.76 (12H, m, Ar—H) |

The compounds obtained by the synthesis examples 3, 4, 5 and 8 are the compounds represented by general formula (1), and the compounds obtained by the synthesis examples 6 and 7 are the compounds represented by general formula (2).

Example 1

Example 1 of the pattern formation method of this invention will now be described with reference to FIGS. 3A through 3D.

Figure 3A:
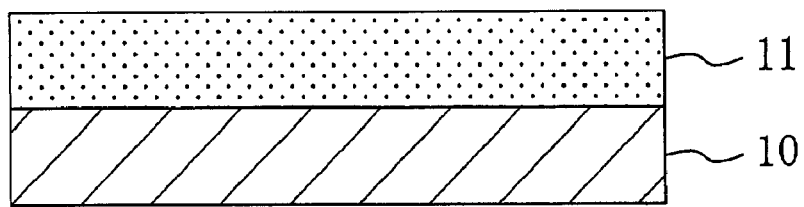
FIGS. 3A, 3B, 3C and 3D are cross-sectional views for showing procedures in a pattern formation method of Example 1 for specifically practicing the embodiment of the invention.

First, a chemically amplified resist material having the following composition is prepared:

Poly(p-hydroxystyrene/styrene/tert-butyl acrylate) [the compound obtained by the synthesis example 1 of the base polymer]: 6.0 g Diphenyl-2,4,6-trimethylphenylsulfonium pentafluorobenzenesulfonate [the compound obtained by the synthesis example 1 of the acid generator]: 0.3 g Dicyclohexylmethylamine: 0.01 g Fluorine-containing nonionic surface active agent [commercially available]: 0.1 g Propylene glycol monomethyl ether acetate: 60.0 g The chemically amplified resist material is filtered with a membrane filter of 0.1 μm, and the resultant is applied on a silicon substrate 10 by spin coating. Thereafter, the resultant substrate is subjected to pre-bake at a temperature of 130° C. for 90 seconds by using a hot plate. Thus, a resist film 11 with a thickness of 0.2 μm is obtained as shown in FIG. 3A.

Figure 3B:
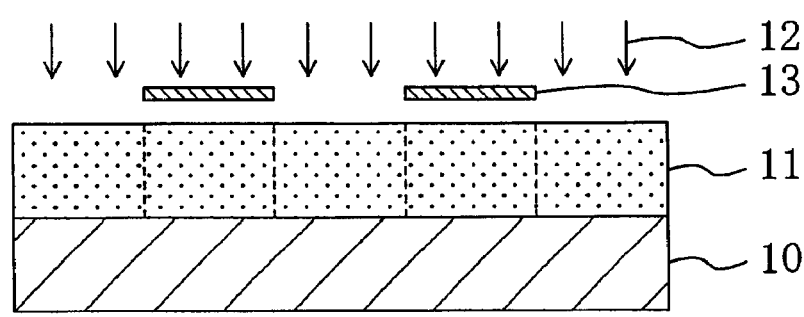

Next, the resist film 11 is irradiated, for pattern exposure, through a mask 13 with electron beams 12 emitted by an EB projection exposure system (with an accelerating voltage of 100 keV) as shown in FIG. 3B.

Figure 3C:
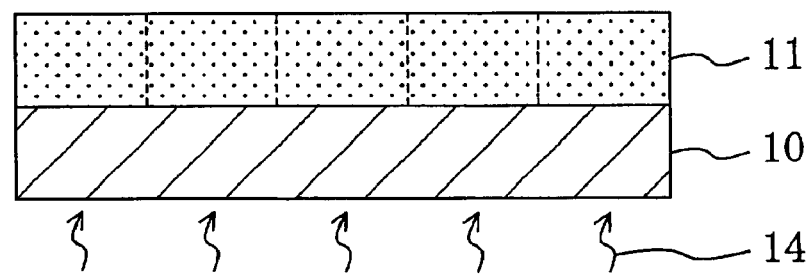

After the pattern exposure, the resist film 11 is subjected to post-exposure-bake 14 at a temperature of 130° C. for 90 seconds by using a hot plate as shown in FIG. 3C.

Figure 3D:
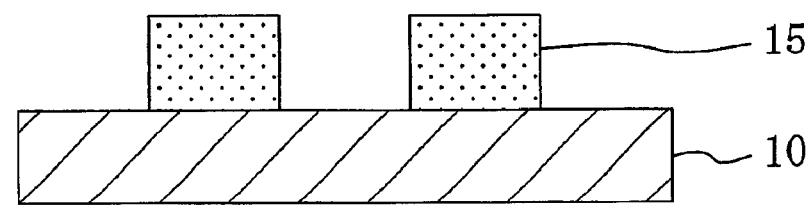

After the post-exposure-bake, the resist film 11 is developed with a 2.38% tetramethylammonium hydroxide aqueous solution and rinsed with water. Thus, a resist pattern 15 is formed from an exposed portion of the resist film 11 as shown in FIG. 3D.

The thus obtained resist pattern 15 has resolution of line and space of 80 nm with sensitivity of 10.0 μC/cm$^2$ and is in a good rectangular shape.

Example 2

Example 2 of the pattern formation method of this invention will be now described.

First, a chemically amplified resist material having the following composition is prepared:

Poly(p-hydroxystyrene/styrene/tert-butyl acrylate): 6.0 g

Triphenylsulfonium pentafluorobenzenesulfonate [the compound obtained by the synthesis example 2 of the acid generator]: 0.3 g Dicyclohexylmethylamine: 0.01 g Fluorine-containing nonionic surface active agent [commercially available]: 0.1 g Propylene glycol monomethyl ether acetate: 60.0 g A resist pattern is formed by using this chemically amplified resist material in the same manner as in Example 1.

The obtained resist pattern has resolution of line and space of 100 nm with sensitivity of 7.6 μC/cm$^2$ and is in a shape with a slightly rounded top portion.

Example 3

Example 3 of the pattern formation method of this invention will now be described with reference to FIGS. 4A through 4D.

First, a chemically amplified resist material having the following composition is prepared:

Poly(p-hydroxystyrene/styrene/tert-butyl acrylate): 6.0 g

Figure 4A:
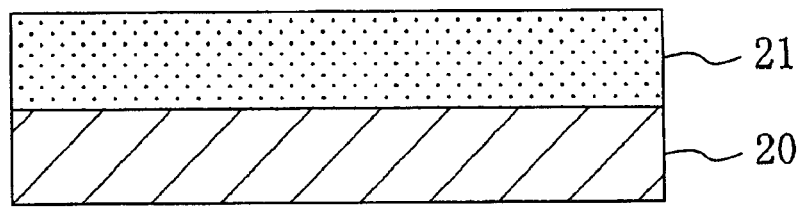
FIGS. 4A, 4B, 4C and 4D are cross-sectional views for showing procedures in a pattern formation method of Example 3 for specifically practicing the embodiment of the invention.

Diphenyl-2,4,6-trimethylphenylsulfonium 2,5-dichlorobenzenesulfonate [the compound obtained by the synthesis example 3 of the acid generator]: 0.3 g Dicyclohexylmethylamine: 0.01 g Fluorine-containing nonionic surface active agent [commercially available]: 0.1 g Propylene glycol monomethyl ether acetate: 60.0 g The chemically amplified resist material is filtered with a membrane filter of 0.1 μm, and the resultant is applied on a silicon substrate 20 by spin coating. Thereafter, the resultant substrate is subjected to pre-bake at a temperature of 130° C. for 90 seconds by using a hot plate. Thus, a resist film 21 with a thickness of 0.2 μm is obtained as shown in FIG. 4A.

Figure 4B:
Figure 4B:
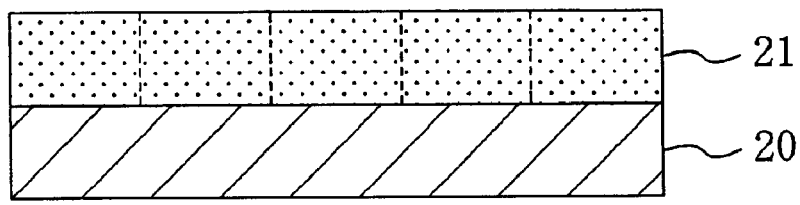

Next, the resist film 21 is irradiated, for pattern exposure, with extreme UV (of a wavelength of a 13.5 nm band) emitted by a extreme UV exposure system (with NA of 0.1) and reflected by a mask not shown as shown in FIG. 4B.

Figure 4C:
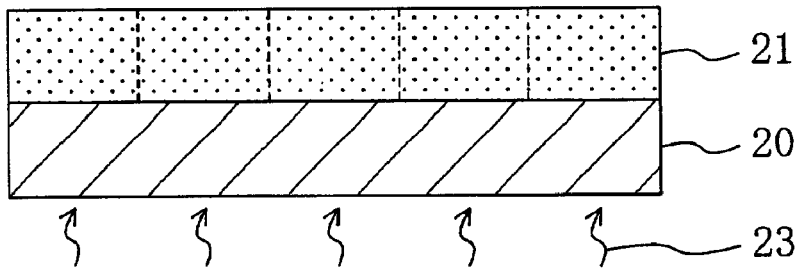

After the pattern exposure, the resist film 21 is subjected to post-exposure-bake 23 at a temperature of 130° C. for 90 seconds by using a hot plate as shown in FIG. 4C.

Figure 4D:
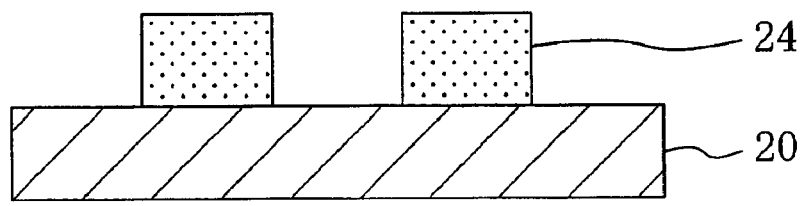

After the post-exposure-bake, the resist film 21 is developed with a 2.38% tetramethylammonium hydroxide aqueous solution and rinsed with water. Thus, a resist pattern 24 is formed from an unexposed portion of the resist film 21 as shown in FIG. 4D.

The thus obtained resist pattern 24 has resolution of line and space of 70 nm with sensitivity of 8.5 mJ/cm$^2$ and is in a good rectangular shape.

Example 4

Example 4 of the pattern formation method of this invention will now be described.

First, a chemically amplified resist material having the following composition is prepared:

Poly(p-hydroxystyrene/styrene/tert-butyl-acrylate): 6.0 g

Diphenyl-2,4,6-trimethylphenylsulfonium 3-trifluoromethylbenzenesulfonate [the compound obtained by the synthesis example 4 of the acid generator]: 0.3 g Dicyclohexylmethylamine: 0.01 g Fluorine-containing nonionic surface active agent [commercially available]: 0.1 g Propylene glycol monomethyl ether acetate: 60.0 g A resist pattern is formed by using this chemically amplified resist material in the same manner as in Example 1.

The obtained resist pattern has resolution of line and space of 80 nm with sensitivity of 13.3 $\mu C/cm^2$ and is in a substantially rectangular shape.

Example 5

Example 5 of the pattern formation method of this invention will now be described.

First, a chemically amplified resist material having the following composition is prepared:

Poly(p-hydroxystyrene/styrene/tert-butyl acrylate): 6.0 g

Diphenyl-2,4,6-trimethylphenylsulfonium 3-nitrobenzenesulfonate [the compound obtained by the synthesis example 5 of the acid generator]: 0.3 g Dicyclohexylmethylamine: 0.01 g Fluorine-containing nonionic surface active agent [commercially available]: 0.1 g Propylene glycol monomethyl ether acetate: 60.0 g A resist pattern is formed by using this chemically amplified resist material in the same manner as in Example 3.

The obtained resist pattern has resolution of line and space of 70 nm with sensitivity of 7.8 $mJ/cm^2$ and is in a substantially rectangular shape.

Example 6

Example 6 of the pattern formation method of this invention will now be described.

First, a chemically amplified resist material having the following composition is prepared:

Poly(p-hydroxystyrene/styrene/tert-butyl acrylate): 6.0 g

Triphenylsulfonium 2,5-dichlorobenzenesulfonate [the compound obtained by the synthesis example 6 of the acid generator]: 0.3 g Dicyclohexylmethylamine: 0.01 g Fluorine-containing nonionic surface active agent [commercially available]: 0.1 g Propylene glycol monomethyl ether acetate: 60.0 g A resist pattern is formed by using this chemically amplified resist material in the same manner as in Example 1.

The obtained resist pattern has resolution of line and space of 90 nm with sensitivity of 5.0 $\mu C/cm^2$ and is in a shape with a slightly rounded top portion.

Example 7

Example 7 of the pattern formation method of this invention will now be described.

First, a chemically amplified resist material having the following composition is prepared:

Poly(p-hydroxystyrene/styrene/tert-butyl acrylate): 6.0 g

Triphenylsulfonium 3,5-trifluoromethylbenzenesulfonate [the compound obtained by the synthesis example 7 of the acid generator]: 0.3 g Dicyclohexylmethylamine: 0.01 g Fluorine-containing nonionic surface active agent [commercially available]: 0.1 g Propylene glycol monomethyl ether acetate: 60.0 g A resist pattern is formed by using this chemically amplified resist material in the same manner as in Example 3.

The obtained resist pattern has resolution of line and space of 80 nm with sensitivity of 6.5 $mJ/cm^2$ and is in a substantially rectangular shape.

Example 8

Example 8 of the pattern formation method of this invention will now be described.

First, a chemically amplified resist material having the following composition is prepared:

Poly(p-hydroxystyrene/styrene/tert-butyl acrylate): 6.0 g

Diphenyl-2,4,6-trimethylphenylsulfonium pentafluorobenzenesulfonate: 0.1 g

Triphenylsulfonium pentafluorobenzenesulfonate: 0.2 g

Dicyclohexylmethylamine: 0.01 g

Fluorine-containing nonionic surface active agent [commercially available]: 0.1 g Propylene glycol monomethyl ether acetate: 60.0 g A resist pattern is formed by using this chemically amplified resist material in the same manner as in Example 1.

The obtained resist pattern has resolution of line and space of 80 nm with sensitivity of 5.2 $\mu C/cm^2$ and is in a substantially rectangular shape.

Example 9

Example 9 of the pattern formation method of this invention will now be described.

First, a chemically amplified resist material having the following composition is prepared:

Poly(p-hydroxystyrene/p-methylstyrene/tert-butyl acrylate) [the compound obtained by the synthesis example 2 of the base polymer]: 6.0 g Diphenyl-2,4,6-trimethylphenylsulfonium pentafluorobenzenesulfonate: 0.1 g Triphenylsulfonium pentafluorobenzenesulfonate: 0.2 g Dicyclohexylmethylamine: 0.02 g Fluorine-containing nonionic surface active agent [commercially available]: 0.1 g Propylene glycol monomethyl ether acetate: 40.0 g Propylene glycol monomethyl ether: 20.0 g A resist pattern is formed by using this chemically amplified resist material in the same manner as in Example 3.

The obtained resist pattern has resolution of line and space of 80 nm with sensitivity of 7.0 $mJ/cm^2$ and is in a substantially rectangular shape.

Example 10

Example 10 of the pattern formation method of this invention will now be described.

First, a chemically amplified resist material having the following composition is prepared:

Poly(p-hydroxystyrene/styrene/1-adamantyl acrylate) [the compound obtained by the synthesis example 3 of the base polymer]: 6.0 g Diphenyl-2,4,6-trimethylphenylsulfonium pentafluorobenzenesulfonate: 0.1 g Triphenylsulfonium pentafluorobenzenesulfonate: 0.2 g Dicyclohexylmethylamine: 0.02 g Fluorine-containing nonionic surface active agent [commercially available]: 0.1 g Propylene glycol monomethyl ether acetate: 40.0 g Propylene glycol monomethyl ether: 20.0 g A resist pattern is formed by using this chemically amplified resist material in the same manner as in Example 1.

The obtained resist pattern has resolution of line and space of 80 nm with sensitivity of 9.4 $\mu C/cm^2$ and is in a substantially rectangular shape.

Example 11

Example 11 of the pattern formation method of this invention will now be described.

First, a chemically amplified resist material having the following composition is prepared:

Poly(p-hydroxystyrene/styrene/tert-butyl acrylate): 6.0 g

Diphenyl-4-methylphenylsulfonium pentafluorobenzensulfonate [the compound obtained by the synthesis example 8 of the acid generator]: 0.3 g Dicyclohexylmethylamine: 0.01 g Fluorine-containing nonionic surface active agent [commercially available]: 0.1 g Propylene glycol monomethyl ether acetate: 60.0 g A resist pattern is formed by using this chemically amplified resist material in the same manner as in Example 3.

The obtained resist pattern has resolution of line and space of 80 nm with sensitivity of 10.8 mJ/cm$^2$ and is in a substantially rectangular shape.

Example 12

Example 12 of the pattern formation method of this invention will now be described.

First, a chemically amplified resist material having the following composition is prepared:

Poly(p-hydroxystyrene/styrene/tert-butyl acrylate): 6.0 g

Diphenyl-4-methylphenylsulfonium pentafluorobenzene-sulfonate: 0.15 g

Triphenylsulfonium 2,5-dichlorobenzenesulfonate: 0.15 g

Dicyclohexylmethylamine: 0.01 g

Fluorine-containing nonionic surface agent [commercially available]: 0.1 g

Propylene glycol monomethyl ether acetate: 60.0 g

A resist pattern is formed by using this chemically amplified resist material in the same manner as in Example 1.

The obtained resist pattern has resolution of line and space of 70 nm with sensitivity of 11.3 $\mu C/cm^2$ and is in a substantially rectangular shape.

Example 13

Example 13 of the pattern formation method of this invention will now be described.

First, a chemically amplified resist material having the following composition is prepared:

Poly(p-hydroxystyrene/styrene/tert-butyl acrylate): 6.0 g

Diphenyl-4-methylphenylsulfonium pentafluorobenzene-sulfonate: 0.15 g

Triphenylsulfonium 3,5-di-trifluoromethylbenzenesulfonate: 0.15 g

Dicyclohexylmethylamine: 0.01 g

Fluorine-containing nonionic surface active agent [commercially available]: 0.1 g Propylene glycol monomethyl ether acetate: 60.0 g A resist pattern is formed by using this chemically amplified resist material in the same manner as in Example 3.

The obtained resist pattern has resolution of line and space of 70 nm with sensitivity of 7.7 mJ/cm$^2$ and is in a substantially rectangular shape.

Example 14

Example 14 of the pattern formation method of this invention will now be described.

First, a chemically amplified resist material having the following composition is prepared:

Poly(p-hydroxystyrene/p-methylstyrene/tert-butyl acrylate): 6.0 g

Diphenyl-2,4,6trimethylphenylsulfonium 3-trifluoromethylbenzenesulfonate: 0.1 g

Triphenylsulfonium pentafluorobenzenesulfonate: 0.2 g

Dicylohexylmethylamine: 0.01 g

Fluorine-containing nonionic surface active agent [commercially available]: 0.1 g Propylene glycol monomethyl ether acetate: 60.0 g A resist pattern is formed by using this chemically amplified resist material in the same manner as in Example 1.

The obtained resist pattern has resolution of line and space of 70 nm with sensitivity of 8.8 $\mu C/cm^2$ and is in a substantially rectangular shape.

Now, comparative examples practiced for evaluating the present invention will be described. The acid generator used in each comparative example is obtained in the same manner as in the synthesis example 1 of the acid generator.

Comparative Example 1

A pattern formation method of Comparative Example 1 will now be described with reference to FIGS. 5A through 5D.

First, a chemically amplified resist material having the following composition is prepared:

Poly(p-hydroxystyrene/styrene/tert-butyl acrylate): 6.0 g

Triphenylsulfonium trifluoromethanesulfonate: 0.3 g

Dicyclohexylmethylamine: 0.01 g

Figure 5A:
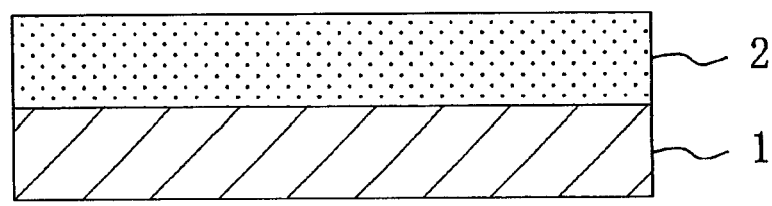
FIGS. 5A, 5B, 5C and 5D are cross-sectional views for showing procedures in a pattern formation method of Comparative Example 1 practiced for evaluating the invention.

Fluorine-containing nonionic surface active agent [commercially available]: 0.1 g Propylene glycol monomethyl ether acetate: 60.0 g The chemically amplified resist material is filtered with a membrane filter of 0.1 $\mu m$, and the resultant is applied on a silicon substrate 1 by spin coating. Thereafter, the resultant substrate is subjected to pre-bake at a temperature of 130° C. for 90 seconds by using a hot plate. Thus, a resist film 2 with a thickness of 0.2 $\mu m$ is obtained as shown in FIG. 5A.

Figure 5B:
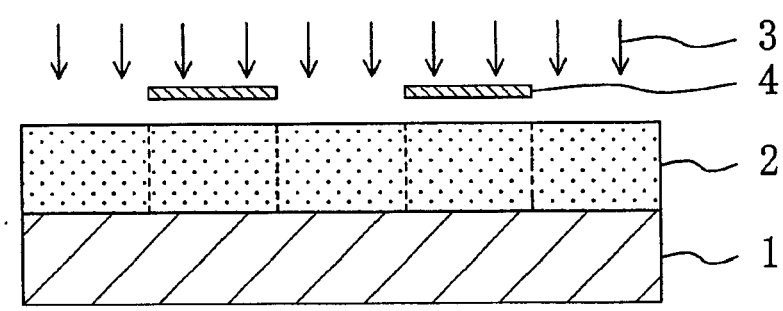

Next, the resist film 2 is irradiated, for pattern exposure, through a mask 4 with electron beams 3 emitted by an EB projection exposure system (with an accelerating voltage of 100 keV) as shown in FIG. 5B.

Figure 5C:
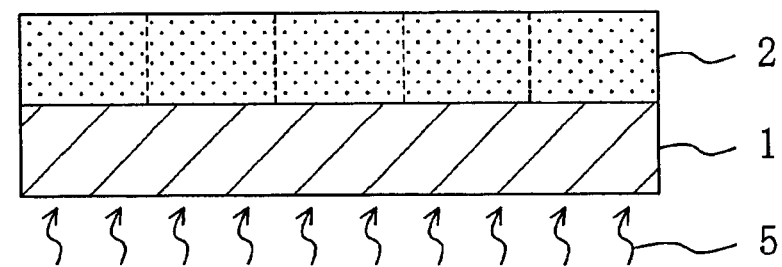

After the pattern expsoure, the resist film 2 is subjected to post-exposure-bake 5 at a temperature of 110° C. for 90 seconds by using a hot plate as shown in FIG. 5C.

Figure 5D:
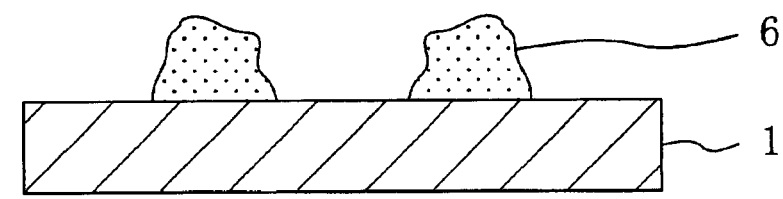

After the post-exposure-bake, the resist film 2 is developed with a 2.38% tetramethylammonium hydroxide aqueous solution and rinsed with water. Thus, a resist pattern 6 is formed from an unexposed portion of the resist film 2 as shown in FIG. 5D.

The thus obtained resist pattern 6 has resolution of line and space of merely 140 nm with sensitivity of 4.5 $\mu C/cm^2$ and is in a defective pattern shape having a largely rounded top portion with a reduced thickness.

Comparative Example 2

A pattern formation method of Comparative Example 2 will now be described with reference to FIGS. 6A through 6D.

First, a chemically amplified resist material having the following composition is prepared:

Poly(p-hydroxystyrene/styrene/tert-butyl acrylate): 6.0 g

Triphenylsulfonium p-toluenesulfonate: 0.3 g

Dicyclohexylmethylamine: 0.01 g

Figure 6A:
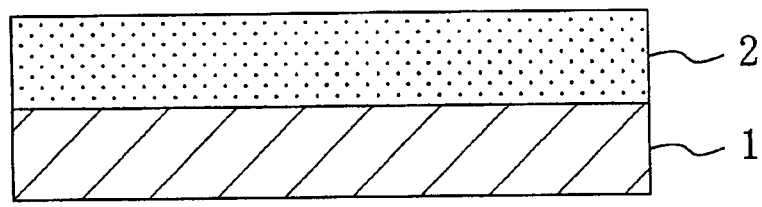
FIGS. 6A, 6B, 6C and 6D are cross-sectional views for showing procedures in a pattern formation method of Comparative Example 2 practiced for evaluating the invention.

Fluorine-containing nonionic surface active agent [commercially available]: 0.1 g Propylene glycol monomethyl ether acetate: 60.0 g The chemically amplified resist material is filtered with a membrane filter of 0.1 μm, and the resultant is applied on a silicon substrate 1 by spin coating. Thereafter, the resultant substrate is subjected to pre-bake at a temperature of 130° C. for 90 seconds by using a hot plate. Thus, a resist film 2 with a thickness of 0.2 μm is obtained as shown in FIG. 6A.

Figure 6B:
Figure 6B:
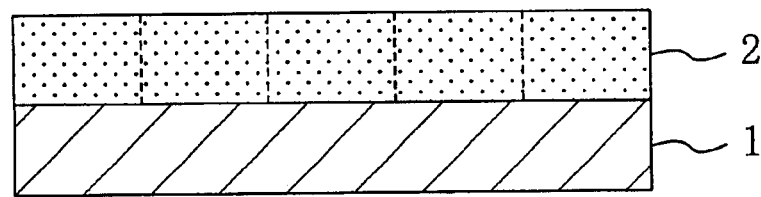

Next, the resist film 2 is irradiated, for pattern exposure, with extreme UV (of a wavelength of a 13.5 nm band) emitted by an extreme UV exposure system (with NA of 0.1) and reflected by a mask not shown as shown in FIG. 6B.

Figure 6C:
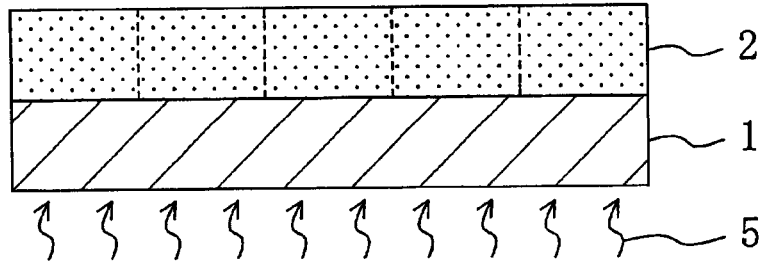

After the pattern exposure, the resist film 2 is subjected to post-exposure-bake 5 at a temperature of 110° C. for 90 seconds by using a hot plate as shown in FIG. 6C.

Figure 6D:
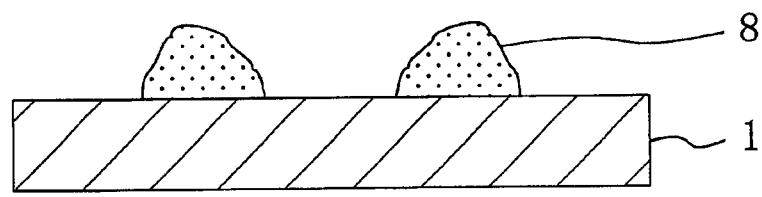

After the post-exposure-bake, the resist film 2 is developed with a 2.38% tetramethylammonium hydroxide aqueous solution and rinse with water. Thus, a resist pattern 8 is formed from an unexposed portion of the resist film 2 as shown in FIG. 6D.

The thus obtained resist pattern 8 has resolution of line and space of merely 150 nm with sensitivity of 16.7 mJ/cm$^2$ and is in a defective tapered shape with a reduced thickness.

Comparative Example 3

A pattern formation method of Comparative Example 3 will now be described.

First, a chemically amplified resist material having the following composition is prepared:

Poly(p-hydroxystyrene/styrene/tert-butyl acrylate): 6.0 g

Diphenyl-4-methylphenylsulfonium trifluoromethanesulfonate: 0.3 g

Dicyclohexylmethylamine: 0.01 g

Fluorine-containing nonionic surface active agent [commercially available]: 0.1 g Propylene glycol monomethyl ether acetate: 60.0 g A resist pattern is formed by using this chemically amplified resist material in the same manner as in Comparative Example 1.

The obtained resist pattern has resolution of line and space of merely 150 nm with sensitivity of 6.1 μC/cm$^2$ and is in a defective shape having an elongated bottom.

Comparative Example 4

A pattern formation method of Comparative Example 4 will now be described.

First, a chemically amplified resist material having the following composition is prepared:

Poly(p-hydroxystyrene/styrene/tert-butyl acrylate): 6.0 g

Diphenyl-2,4,6-trimethylphenylsulfonium p-toluenesulfonate: 0.3 g

Dicyclohexylmethylamine: 0.01 g

Fluorine-containing nonionic surface active agent [commercially available]: 0.1 g Propylene glycol monomethyl ether acetate: 60.0 g A resist pattern is formed by using this chemically amplified resist material in the same manner as in Comparative Example 2.

In the obtained resist pattern, line and space of 140 nm cannot be resolved with sensitivity of 17.8 mJ/cm$^2$ and the pattern is in a defective tapered shape.

Comparative Example 5

A pattern formation method of Comparative Example 5 will now be described.

First, a chemically amplified resist material having the following composition is prepared:

Poly(p-hydroxystyrene/styrene/tert-butyl acrylate): 6.0 g

Triphenylsulfonium perfluorobutanesulfonate: 0.3 g

Dicyclohexylmethylamine: 0.01 g

Fluorine-containing nonionic surface active agent [commercially available]: 0.1 g Propylene glycol monomethyl ether acetate: 60.0 g A resist pattern is formed by using this chemically amplified resist material in the same manner as in Comparative Example 1.

In the obtained resist pattern has resolution of line and space of merely 110 nm with sensitivity of 8.1 μC/cm$^2$ and is in a defective shape having a largely rounded top portion.

Comparative Example 6

A pattern formation method of Comparative Example 6 will now be described.

First, a chemically amplified resist material having the following composition is prepared:

Poly(p-hydroxystyrene/styrene/tert-butyl acrylate): 6.0 g

Triphenylsulfonium perfluorooctanesulfonate: 0.3 g

Dicyclohexylmethylamine: 0.01 g

Fluorine-containing nonionic surface active agent [commercially available]: 0.1 g Propylene glycol monomethyl ether acetate: 60.0 g A resist pattern is formed by using this chemically amplified resist material in the same manner as in Comparative Example 2.

The obtained resist pattern has resolution of line and space of merely 120 nm with sensitivity of 9.2 mJ/cm$^2$ and is in a defective shape having a largely rounded top portion.

Comparative Example 7

A pattern formation method of Comparative Example 7 will now be described.

First, a chemically amplified resist material having the following composition is prepared:

Poly(p-hydroxystyrene/styrene/tert-butyl acrylate): 6.0 g

Diphenyl-4-tert-butylphenylsulfonium perfluorooctanesulfonate: 0.3 g

Dicyclohexylmethylamine: 0.01 g

Fluorine-containing nonionic surface active agent [commercially available]: 0.1 g Propylene glycol monomethyl ether acetate: 60.0 g A resist pattern is formed by using this chemically amplified resist material in the same manner as in Comparative Example 1.

The obtained resist pattern has resolution of line and space of merely 120 nm with sensitivity of 17.1 $\mu C/cm^2$ and is in a defective shape having an overhang top portion.

Comparative Example 8

A pattern formation method of Comparative Example 8 will now be described.

First, a chemically amplified resist material having the following composition is prepared:

Poly(p-hydroxystyrene/styrene/tert-butyl acrylate): 6.0 g

Diphenyl-2,4,6-trimethylphenylsulfonium 4-chlorobenzenesulfonate: 0.3 g

Dicyclohexylmethylamine: 0.01 g

Fluorine-containing nonionic surface active agent [commercially available]: 0.1 g Propylene glycol monomethyl ether acetate: 60.0 g A resist pattern is formed by using this chemically amplified resist material in the same manner as in Comparative Example 2.

The obtained resist pattern has resolution of line and space of merely 140 nm with sensitivity of 12.3 $mJ/cm^2$ and is in a defective shape having a largely rounded top portion.

Comparative Example 9

A pattern formation method of Comparative Example 9 will now be described.

First, a chemically amplified resist material having the following composition is prepared:

Poly(p-hydroxystyrene/styrene/tert-butyl acrylate): 6.0 g

Diphenyl-2,4,6-trimethylphenylsulfonium 4-trifluoromethylbenzenesulfonate: 0.3 g Dicyclohexylmethylamine: 0.01 g Fluorine-containing nonionic surface active agent [commercially available]: 0.1 g Propylene glycol monomethyl ether acetate: 60.0 g A resist pattern is formed by using this chemically amplified resist material in the same manner as in Comparative Example 1.

The obtained resist pattern has resolution of line and space of merely 110 nm with sensitivity of 15.9 $\mu C/cm^2$ and is in a defective shape having a rounded top portion.

Comparative Example 10

A pattern formation method of Comparative Example 10 will now be described.

First, a chemically amplified resist material having the following composition is prepared:

Poly(p-hydroxystyrene/styrene/tert-butyl acrylate): 6.0 g

Diphenyl-2,4,6-trimethylphenylsulfonium 2-trifluoromethylbenzenesulfonate: 0.3 g Dicyclohexylmethylamine: 0.01 g Fluorine-containing nonionic surface active agent [commercially available]: 0.1 g Propylene glycol monomethyl ether acetate: 60.0 g A resist pattern is formed by using this chemically amplified resist material in the same manner as in Comparative Example 2.

The obtained resist pattern has resolution of line and space of merely 110 nm with sensitivity of 13.7 $mJ/cm^2$ and is in a defective shape having a rounded top portion.

Comparative Example 11

A pattern formation method of Comparative Example 11 will now be described.

First, a chemically amplified resist material having the following composition is prepared:

Poly(p-hydroxystyrene/styrene/tert-butyl acrylate): 6.0 g

Diphenyl-4-methylphenylsulfonium perfluorooctanesulfonate: 0.3 g

Dicyclohexylmethylamine: 0.01 g

Fluorine-containing nonionic surface active agent [commercially available]: 0.1 g Propylene glycol monomethyl ether acetate: 60.0 g A resist pattern is formed by using this chemically amplified resist material in the same manner as in Comparative Example 1.

The obtained resist pattern has resolution of line and space of merely 120 nm with sensitivity of 17.5 $\mu C/cm^2$ and is in a defective shape having a rounded top portion.

Comparative Example 12

A pattern formation method of Comparative Example 12 will now be described.

First, a chemically amplified resist material having the following composition is prepared:

Poly(p-hydroxystyrene/p-tert-butyoxycarbonyloxystyrene) [composition ratio: 67/33; Mw: 20,500; Mw/Mn: 1.10]: 6.0 g Diphenyl-2,4,6-trimethylphenylsulfonium pentafluorobenzenesulfonate: 0.3 g Dicyclohexylmethylamine: 0.01 g Fluorine-containing nonionic surface active agent [commercially available]: 0.1 g Propylene glycol monomethyl ether acetate: 60.0 g A resist pattern is formed by using this chemically amplified resist material in the same manner as in Comparative Example 2.

The obtained resist pattern has resolution of line and space of merely 110 nm with sensitivity of 7.3 $mJ/cm^2$ and is in a defective shape having a rather overhang top portion.

Comparative Example 13

A pattern formation method of Comparative Example 13 will now be described.

First, a chemically amplified resist material having the following composition is prepared:

Poly(p-hydroxystyrene/p-tert-butyoxytyrene) [composition ratio: 65/35; Mw: 20,300; Mw/Mn: 1.10]: 6.0 g Diphenyl-2,4,6-trimethylphenylsulfonium pentafluorobenzenesulfonate: 0.3 g Dicyclohexylmethylamine: 0.01 g Fluorine-containing nonionic surface active agent [commercially available]: 0.1 g Propylene glycol monomethyl ether acetate: 60.0 g A resist pattern is formed by using this chemically amplified resist material in the same manner as in Comparative Example 1.

The obtained resist pattern has resolution of line and space of merely 120 nm with sensitivity of 7.7 $\mu C/cm^2$ and is in a defective shape having a rather overhang top portion.

Comparative Example 14

A pattern formation method of Comparative Example 14 will now be described.

First, a chemically amplified resist material having the following composition is prepared:

Poly(p-1-ethoxyethoxystyrene/p-hydroxystyrene/p-tert-butoxystyrene) [composition ratio: 24/66/10; Mw: 20,500; Mw/Mn: 1.10]: 6.0 g Diphenyl-2,4,6-trimethylphenylsulfonium pentafluorobenzenesulfonate: 0.3 g Dicyclohexylmethylamine: 0.01 g Fluorine-containing nonionic surface active agent [commercially available]: 0.1 g Propylene glycol monomethyl ether acetate: 60.0 g A resist pattern is formed by using this chemically amplified resist material in the same manner as in Comparative Example 2.

The obtained resist pattern has resolution of line and space of merely 110 nm with sensitivity of 8.2 mJ/cm$^2$ and is defective because of severely roughened side faces although the pattern shape is substantially rectangular.

Comparative Example 15

A pattern formation method of Comparative Example 15 will now be described.

First, a chemically amplified resist material having the following composition is prepared:

Poly(p-hydroxystyrene/styrene/tert-butyl acrylate): 6.0 g

Di-(p-tert-butylphenyl)iodonium perfluorobutanesulfonate: 0.3 g

Dicyclohexylmethylamine: 0.01 g

Fluorine-containing nonionic surface active agent [commercially available]: 0.1 g Propylene glycol monomethyl ether acetate: 60.0 g A resist pattern is formed by using this chemically amplified resist material in the same manner as in Comparative Example 1.

The obtained resist pattern has resolution of line and space of merely 120 nm with sensitivity of 9.1 $\mu$C/cm$^2$ and is in a defective shape having a rounded top portion.

Comparative Example 16

A pattern formation method of Comparative Example 16 will now be described.

First, a chemically amplified resist material having the following composition is prepared:

Poly(p-hydroxystyrene/styrene/tert-butyl acrylate): 6.0 g

N-trifluoromethanesulfonyloxy-5-norbornene-2,3-dicarboxyimide: 0.3 g

Dicyclohexylmethylamine: 0.01 g

Fluorine-containing nonionic surface active agent [commercially available]: 0.1 g Propylene glycol monomethyl ether acetate: 60.0 g A resist pattern is formed by using this chemically amplified resist material in the same manner as in Comparative Example 2.

The obtained resist pattern has resolution of line and space of merely 130 nm with sensitivity of 9.6 mJ/cm$^2$ and is in a defective shape having a rounded top portion and severely roughened side faces.

Verification of the aforementioned results can be concluded as follows: Although Comparative Examples 1, 3, 5, 6 and 12 through 16 attain high sensitivity equivalent to that of Examples 1 through 14, the resolution performance is rather inferior due to the defective pattern shape and roughened side faces. Comparative Examples 2, 4 and 7 through 11 are inferior to any of Examples 1 through 14 in all of the sensitivity, the resolution and the pattern shape.

As a result, it is confirmed that the pattern formation method of this invention can attain sensitivity and resolution higher than those attained by the conventional technique.

Also, it is proved, through comparison between Examples 1 through 7 and 11 and Examples 8 through 10 and 12 through 16, that much higher sensitivity and much higher resolution can be attained by using, as the acid generator, a mixture of the compound represented by general formula (1) and the compound represented by general formula (2) than by singly using the compound represented by general formula (1).

What is claimed is:

1. A pattern formation method comprising the steps of:

forming a resist film with a thickness of 250 nm or less from a positive chemically amplified resist material including a base polymer, a first acid generator and a second acid generator that have at least one electron attractive group introduced into a meta position of an aromatic ring included in each of a counter anion and generator an acid through irradiation with energy beams;

performing pattern exposure by selectively irradiating said resist film with electron beams or extreme UV of a wavelength of a 1 nm through 30 nm band; and developing said resist film after the pattern exposure, whereby forming a resist pattern;

wherein said first acid generator includes a compound represented by general formula (1):

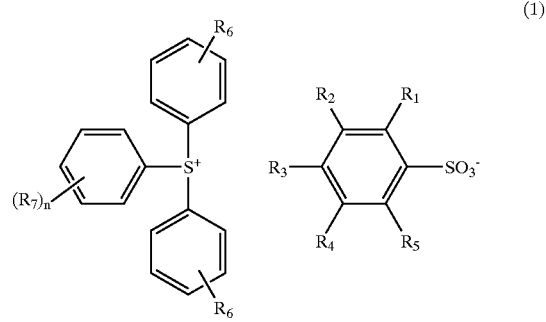

where $R_2$ and $R_4$ are the same or different, at least one of which is not a hydrogen atom, and are selected from the group consisting of a hydrogen atom, a halogen atom, a nitro group and a trifluoromethyl group; $R_1$, $R_3$ and $R_5$ are the same or different and each is a hydrogen atom or a halogen atom; $R_6$ is a hydrogen atom or a linear or branched alkyl group having a carbon number of 1 through 4; and $R_7$ is a linear or branched alkyl group having a carbon number of 1 through 4;

wherein said second acid generator includes a compound represented by general formula (2):

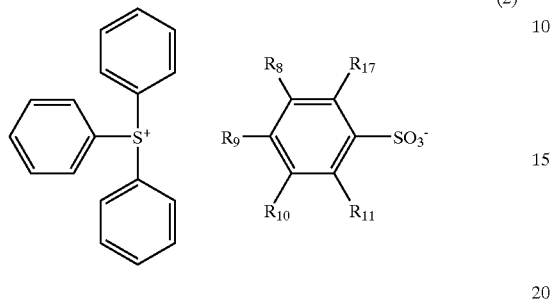

(2)

wherein $R_8$ and $R_{10}$ are the same or different, at least one of which is not a hydrogen atom, and are selected from the group consisting of a hydrogen atom, a halogen atom, a nitro group and a trifluoromethyl group; and $R_9$, $R_{11}$ and $R_{17}$ are the same or different and each is a hydrogen atom or a halogen atom, wherein the weight ratio of said compound represented by general formula (1) to said compound represented by general formula (2) is 0.2 through 2.0.

2. The pattern formation method of claim 1, further comprising, between the step of performing pattern exposure and the step of developing said resist film, a step of performing post-exposure-bake on said resist film at a temperature of 120° C. through 150° C.

3. The pattern formation method of claim 1, wherein a counter anion of said compound represented by general formula (1) is pentafluorobenzenesulfonate, 3-trifluoromethylbenzenesulfonate or 3,5-di-trifluoromethylbenzenesulfonate.

4. The pattern formation method of claim 1, wherein a counter anion of said compound represented by general formula (2) is pentafluorobenzenesulfonate, 3-trifluoromethylbenzenesulfonate or 3,5-di-trifluoromethylbenzenesulfonate.

5. The pattern formation method of claim 1, wherein said compound represented by general formula (1) is diphenyl-2,4,6-trimethylphenylsulfonium pentafluorobenzenesulfonate or diphenyl-4-methylphenylsulfonium pentafluorobenzenesulfonate, and said compound represented by general formula (2) is triphenylsulfonium pentafluorobenzenesulfonate or triphenylsulfonium 3-trifluoromethylbenzenesulfonate.

6. The pattern formation method of claim 1, wherein said base polymer includes a first monomer unit represented by general formula (3), a second monomer unit represented by general formula (4) and a third monomer unit represented by general formula (5):

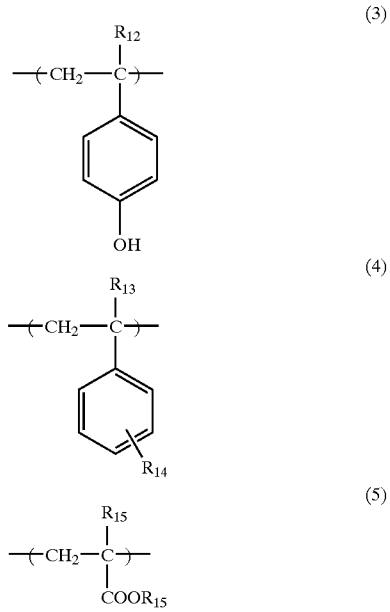

where $R_{12}$ is a hydrogen atom or a methyl group; $R_{13}$ is a hydrogen atom or a methyl group; $R_{14}$ is a hydrogen atom or a linear or branched alkyl group having a carbon number of 1 through 4; $R_{15}$ is a hydrogen atom or a methyl group; and $R_{16}$ is a protecting group.

7. The pattern formation method of claim 6, where in general formula (5), $R_{16}$ is a tert-butyl group, a tert-pentyl group, a 1-methylcyclohexyl group, a tetrahydropyranyl group, a tetrahydrofuranyl group, a 1-adamantyl group, a 2-methyl-2-adamantyl group or a 4-methyl-2-oxo-4-tetrahydropyranyl group.

8. The pattern formation method of claim 1, wherein said base polymer includes a compound represented by general formula (6):

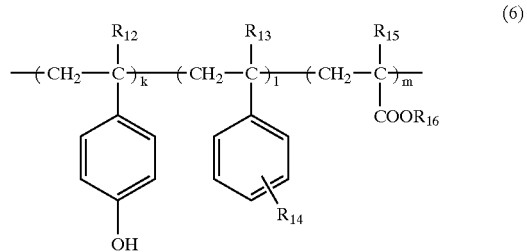

where $R_{12}$ is a hydrogen atom or a methyl group; $R_{13}$ is a hydrogen atom or a methyl group; $R_{14}$ is a hydrogen atom or a linear or branched alkyl group having a carbon number 1 through 4; $R_{15}$ is a hydrogen atom or a methyl group; $R_{16}$ is a protecting group; and k, l and m are positive integers satisfying $0.25 \geq 1/(k+l+m) \geq 0.10$ and $0.20 \geq m/(k+l+m) \geq 0.07$.

9. The pattern formation method of claim 1, wherein said base polymer has a weight-average molecular weight of 5,000 through 20,000 and a degree of dispersion of 1.0 through 2.5.

* * * * *